United States Patent
Namura

(10) Patent No.: US 7,079,596 B1
(45) Date of Patent: Jul. 18, 2006

(54) MULTIBAND DATA COMMUNICATION APPARATUS, COMMUNICATION METHOD OF MULTIBAND DATA COMMUNICATION APPARATUS, AND STORAGE MEDIUM

(75) Inventor: Yasuaki Namura, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/535,303

(22) Filed: Mar. 24, 2000

(30) Foreign Application Priority Data

Mar. 25, 1999 (JP) .................. 11-082514

(51) Int. Cl.
*H04L 27/22* (2006.01)

(52) U.S. Cl. ........................ 375/324

(58) Field of Classification Search ......... 375/260, 375/261, 271, 280, 284, 285, 295, 302, 306, 375/316, 322, 325, 326, 350, 301; 455/143, 455/132, 133, 303, 314, 318, 76, 75, 131, 455/180.1, 189.1, 190.1, 141, 147, 207, 209, 455/257, 266, 552, 553, 85–86, 319, 258, 455/260; 370/481, 482, 483, 206; 331/12
See application file for complete search history.

(56) References Cited

U.S. PATENT DOCUMENTS 5,437,051 A   7/1995 Oto
5,678,222 A * 10/1997 Hornak et al. ............ 379/93.26
6,148,181 A * 11/2000 Otaka ............................ 455/86
6,337,976 B1 *  1/2002 Kudou ......................... 455/258
6,496,545 B1 * 12/2002 Liu ............................... 375/301

FOREIGN PATENT DOCUMENTS

| EP | 0 651 522 A1 | 5/1995 |
| EP | 0 653 851 A2 | 5/1995 |
| JP | 03-044247 | 2/1991 |
| JP | 3-105053 | 10/1991 |
| JP | 09-233044 | 9/1997 |
| JP | 09/247226 | 9/1997 |
| JP | 11-340860 | 10/1999 |
| WO | WO 00/76060 A1 | 12/2000 |

* cited by examiner

*Primary Examiner*—Khanh Tran
(74) *Attorney, Agent, or Firm*—Pearne & Gordon LLP

(57) ABSTRACT

A quadrature demodulator 408' and a quadrature modulator 908' convert a reception intermediate frequency signal 151 into reception baseband signals 157 and 158, and also convert transmission baseband signals 657 and 658 into a transmission intermediate frequency signal 651, respectively. While local oscillation signals having frequencies suitable for the respective bands are outputted from a commonly used local oscillator 111, such a local oscillation signal obtained by shifting a phase thereof $\pi/2$ by a phase shifter 412 is supplied to one mixer of quadrature mixers 109 and 609, and such a signal obtained by inverting, or not inverting the plurality of the local oscillation signal by an exclusive OR gate circuit 413 in response to a band switching signal 153 is supplied to the other mixer of quadrature mixers 110 and 610.

21 Claims, 12 Drawing Sheets

MULTIBAND DATA COMMUNICATION APPARATUS, COMMUNICATION METHOD OF MULTIBAND DATA COMMUNICATION APPARATUS, AND STORAGE MEDIUM

BACKGROUND OF THE INVENTION

The present invention generally relates to a multiband data communication apparatus, a communication method of a multiband data communication apparatus, and a storage medium for storing a program used to execute the communication method of the multiband data communication apparatus. More specifically, the present invention is directed to a multiband data communication apparatus, a communication method of a multiband data communication apparatus, and a storage medium, capable of suppressing a circuit scale to a minimum circuit scale, and further capable of preventing a deterioration in a baseband signal.

As a conventional dual band data communication apparatus, or a conventional multiband data communication apparatus, one conventional data communication apparatus is represented in FIG. 12. That is, FIG. 12 is an arrangement diagram of a conventional multiband data communication apparatus. In this case, as the data communication apparatus, such a data communication apparatus is conceived as a mobile communication apparatus typically known as a digital portable telephone and a paging receiver.

This conventional multiband data communication apparatus is arranged by comprising an antenna 101, a local oscillator 104, a receiver unit, and a transmitter unit. In this apparatus, the receiver unit is provided with an RF (radio frequency) amplifier 102, a downconverter 103, an intermediate frequency amplifier 105, a quadrature demodulator 1208, and a data output circuit 1221, whereas the transmitter unit is provided with a (high power) power amplifier 602, an upconverter 603, a quadrature modulator 1218, and a waveform generating circuit 1222. Referring now to the multiband data communication apparatus shown in FIG. 12, the conventional technique will be described.

First, in the receiver unit, a modulated reception signal which is received by the antenna 101 is amplified by the RF amplifier 102, and thereafter the amplified reception signal is entered into the downconverter 103. The downconverter 103 may output such signals having frequencies which are defined by adding the frequency of the amplified reception signal to a frequency of a local oscillation signal 152 outputted from the local oscillator 104, and also by subtracting the frequency of the amplified reception signal from the frequency of the local oscillation signal 152. In this case, it is now assumed that while using either a low-pass filter or a high-pass filter, the downconverter 103 selects as a reception intermediate frequency signal 151, a signal having such a subtraction frequency lower than the frequency of the received RF signal. The reception intermediate frequency signal 151 having the frequency lower than the frequency of the reception signal, which is outputted from the downconverter 103 is amplified by the intermediate frequency amplifier 105. Then, the amplified intermediate frequency signal is entered into the quadrature demodulator 1208.

The quadrature demodulator 1208 is arranged by two sets of quadrature mixers 109 and 110, a reception local oscillator 111, and a phase shifter 1209. The quadrature mixers 109 and 110 convert the reception intermediate frequency signal into a reception baseband signal 157 and another reception baseband signal 158. The reception local oscillator 111 precisely outputs a signal having a carrier frequency equal to a central frequency of the reception intermediate frequency signal. The phase shifter 1209 produces two signals 155 and 156 whose phase difference is 90 degrees from the reception local signal, and then enters both the signals 155 and 156 into the quadrature mixers 109 and 110.

The quadrature demodulator 1208 enters thereinto the amplified reception intermediate frequency signal, and then outputs two sets of reception baseband signals 157 and 158 whose phase difference is 90 degrees. The data output circuit 1221 decodes reception data 159 by utilizing a phase relationship between the reception baseband signals 157 and 158 having the phase difference by 90 degrees from each other.

Next, a description will now be made of operations of the receiver unit having the quadrature demodulator 1208 equipped with the above-explained function.

In general, assuming now that orthogonal baseband signal components are I(t) and Q(t), and an angular frequency of a carrier wave is "ωRF", a reception signal SRF(t) may be expressed by the following formula (1):

$$SRF(t)=I(t)\cos[\omega RFt]+Q(t)\sin[\omega RFt] \quad (1)$$

It should be noted that a coefficient of an amplitude which is equally applied to the respective terms of the below-mentioned formulae is negligible.

Also, assuming now that an angular frequency of a local oscillation signal is "ωL0" and an arbitrary phase difference is "ØL0", an output signal "SL0(t)" of the local oscillator 104 which is entered into the downconverter 103 is expressed by the following formula (2):

$$SL0(t)=\cos[\omega L0t+ØL0] \quad (2)$$

In the downconverter 103, the reception signal SRF(t) is multiplied by the local oscillation signal $SL0(t)$, so that an output SMIX(t) of the downconverter 103 is given by the following formula (3):

$$\begin{aligned}SMIX(t) &= SL0(t) \cdot SRF(t) \\ &= I(t)\{\cos[(\omega L0+\omega RF)t+ØL0] + \\ &\quad \cos[(\omega L0-\omega RF)t+ØL0]\} + \\ &\quad Q(t)\{\sin[(\omega L0+\omega RF)t+ØL0] + \\ &\quad \sin[(\omega L0-\omega RF)t+ØL0]\}\end{aligned} \quad (3)$$

Also, since the term of "ωL0+ωRF" of the output of the downconverter 103 corresponding to the high frequency component is negligible in either the low-pass filter or the high-pass filter, when ωL0>ωRF, the reception intermediate frequency signal SIF(t) (151) may be expressed by employing this angular frequency ωIF (=ωL0−ωRF):

$$SIF(t)=I(t)\cos[\omega IFt+ØL0]-Q(t)\sin[\omega IFt+ØL0] \quad (4)$$

In the quadrature demodulator 1208, the reception baseband signals 157 and 158 are obtained by multiplying this reception intermediate frequency signal SIF(t) by the reception local oscillation signals 155 and 156 whose phase difference is 90 degrees. Assuming now that the reception baseband signals 157 and 158 correspond to "a(t)" and "b(t)", respectively, these baseband signals are expressed as follows:

$$\begin{aligned}a(t) &= SIF(t)\cos[\omega IFt+ØIF] \\ &= I(t)\{\cos[2\omega IFt+ØL0+ØIF]+\cos[ØL0-ØIF]\} - \\ &\quad Q(t)\{\sin[2\omega IFt+ØL0+ØIF]+\sin[ØL0-ØIF]\}\end{aligned} \quad (5)$$

In this case, since the baseband component is derived by neglecting the high frequency component, the reception baseband signal "a(t)" (157) is eventually given as:

$$a(t)=I(t)\cos[\varnothing BB]+Q(t)\sin[\varnothing BB] \quad (6)$$

In this formula, it is assumed that $\varnothing BB=\varnothing IF-\varnothing L0$.

Similarly, since the other reception baseband signal "b(t)" is equal to SIF(t) sin [ωIFt+ØIF], this baseband signal "b(t)" is expressed as follows:

$$b(t)=I(t)\sin[\varnothing BB]+Q(t)\cos[\varnothing BB] \quad (7)$$

While utilizing the quadrature characteristic of the signals, the respective components I(t) and Q(t) can be derived.

In this case, it is set that ωL0>ωRF. However, such a frequency relationship cannot always be established in such a circuit arrangement capable of handling a plurality of frequency bands called as either "dual band" or "multiband". In other words, in a certain frequency band, the frequency relationship ωL0>ωRF may be established and thus, the above-explained formulae can be calculated. However, considering now that another frequency relationship ωL0<ωRF is established in another frequency band, since ωIF=ωRF−ωL0, the following formulae are given as follows:

$$SIF2(t)=I(t)\cos[\omega IFt-\varnothing L0]+Q(t)\sin[\omega IFt-\varnothing L0] \quad (10)$$

$$a2(t)=I(t)\cos[\varnothing BB2]-Q(t)\sin[\varnothing BB2] \quad (11)$$

$$b2(t)=I(t)\sin[\varnothing BB2]-Q(t)\cos[\varnothing BB2] \quad (12)$$

As a result, reception baseband signals whose phase relations are different from each other are obtained.

In such a case, in the data output circuit 1221, the polarities of the reception baseband signals 157 and 158 are switched by employing the band switching signal 153. As a result, similar reception data 159 may be obtained.

On the other hand, in the transmitter unit, the waveform producing circuit 1222 into which transmission data 659 is inputted produces both a transmission baseband signal 657 and another transmission baseband 658, which may have a phase relationship in accordance with the entered transmission data 659. Then, the waveform producing circuit 1222 enters the transmission baseband signals 657 and 658 to the quadrature modulator 1218.

The quadrature demodulator 1218 is arranged by two sets of quadrature mixers 609 and 610, a transmission local oscillator 611, and a phase shifter 1219, and also an adder 606. The quadrature mixers 609 and 610 convert the transmission baseband signals 657 and 658 into the intermediate frequency signals. The transmission local oscillator 611 precisely outputs a signal having a carrier frequency equal to a central frequency of the intermediate frequency signal. The phase shifter 1219 produces two signals 655 and 656 whose phase difference is 90 degrees from the transmission local signal, and then enters both the signals 655 and 656 into the quadrature mixers 609 and 610. The adder 606 adds two sets of intermediate frequency signals outputted from two sets of the quadrature mixers 609 and 610 to each other, and then outputs a transmission intermediate frequency signal.

The quadrature 1218 enters thereinto both the transmission baseband signals 657 and 658 which own a phase difference in accordance with the transmission data 659, and then outputs a transmission intermediate frequency signal 651. The upconverter 603 outputs signals having frequencies obtained by adding and subtracting the frequency of the entered transmission intermediate frequency signal 651 and the frequency of the entered local oscillation signal 152. However, in this case, while employing either a high-pass filter or a band-pass filter, this up-converter 603 selects such a signal having a summation frequency higher than the original frequency as a transmission RF signal. The transmission RF signal derived from the upconverter 603 is amplified by the (high power) power amplifier 602, and then the amplified power transmission RF signal is outputted from the antenna 101 as the transmission signal.

Next, a description will now be made of operations of the transmitter unit including the quadrature modulator 1218 equipped with the above-explained function.

Generally speaking, in the waveform generating circuit 1222, assuming now that the transmission baseband signals 657 and 658 which own an orthogonal phase relationship between them and are produced from the transmission data 659 are expressed as an "I(t)" and a "Q(t)", respectively, and also an angular frequency of a local oscillation signal outputted from the transmission local oscillator 611 is equal to "ωIF", the transmission intermediate frequency signal 651 may be expressed as follows:

$$SIF(t)=I(t)\cos[\omega IFt]+Q(t)\sin[\omega IFt] \quad (18)$$

It should be noted that a coefficient of an amplitude equally applied to the respective items is negligible.

In the upconverter 603, assuming now that the output signal of the upconverter 603 which is obtained by being multiplied by the output signal $SL0(t)$ of the local oscillator 104 is equal to SMIX(t), this transmission intermediate frequency signal 651 is given as follows:

$$\begin{aligned}SMIX(t) &= SL0(t) \cdot SIF(t) \quad (19)\\
&= \cos[\omega L0t - \varnothing L0] \times \{I(t)\cos[\omega IFt] + Q(t)\sin[\omega IFt]\}\\
&= I(t)\{\cos[(\omega L0 - \omega IF)t + \varnothing L0] +\\
&\quad \cos[(\omega L0 - \omega IF)t + \varnothing L0]\} +\\
&\quad Q(t)\{\sin[(\omega L0 - \omega IF)t + \varnothing L0] - \sin[(\omega L0 - \omega IF)t + \varnothing L0]\}\end{aligned}$$

Only such a desirable frequency component of the signal outputted from the upconverter 603 is selected. In the case that the local frequency is higher than the transmission frequency, assuming now that an angular frequency of a transmission signal SUL(t) is equal to ωRF (=ωL0−ωIF), this transmission signal SUL(t) is given as follows:

$$SUL(t)=I(t)\cos[\omega RFt+\varnothing L0]-Q(t)\sin[\omega RFt+\varnothing L0] \quad (20)$$

However, in such a case that the local frequency lower than the transmission frequency, the angular frequency of the transmission signal becomes ωRF=ωL0+ωIF, and thus this transmission signal SLL(t) is given as follows:

$$SLL(t)=I(t)\cos[\omega RFt+\varnothing L0]+Q(t)\sin[\omega RFt+\varnothing L0] \quad (21)$$

As a result, this transmission signal SLL(t) may become a different transmission signal, depending upon the frequency relationship between the transmission signal and the local signal.

Accordingly, in such a case, in the waveform generating circuit 1222, the polarities of the reception baseband signals 657 and 658 are switched by employing the band switching signal 153, and furthermore, for instance, "Q(t)" is replaced by "−Q(t)" in the above-explained formula, so that a similar transmission signal can be obtained.

However, in the circuit arrangement of the above-explained conventional multiband data communication apparatus for switching the polarity of the baseband signal, a large circuit scale requirement is further made as to both the data output circuit 1221 and the waveform generating circuit 1222 which originally own the large circuit blocks. Moreover, there is another problem that since such a circuit is additionally provided, the signal quality of such a low-noise baseband signal would be deteriorated.

SUMMARY OF THE INVENTION

The present invention has been made to solve the above-described problems, and therefore, has an object to provide a multiband data communication apparatus, and a communication method of a multiband data communication apparatus, capable of suppressing a circuit scale of an additionally provided circuit to a minimum circuit scale, which is suitably constituted in an integrated circuit form, while switching a plurality of frequency bands in response to a band switching signal and furthermore, while a deterioration in a baseband signal is avoided. Another object of the present invention is to provide a storage medium for storing thereinto a computer readable program used to execute the communication method of the multiband data communication apparatus.

To solve the above-described problems, a multiband data communication apparatus, according to first aspect of the present invention, receives signals by switching a plurality of frequency bands in response to a band switching signal, and includes quadrature demodulating means for converting either a reception signal or a reception intermediate frequency signal into a quadrature reception baseband signal, the quadrature demodulating means comprising: a pair of first quadrature mixers for converting either the reception signal or the reception intermediate frequency signal into a reception baseband signal; local oscillating means for producing a local oscillation signal; and phase shifting means for shifting a phase of the local oscillation signal based upon the band switching signal to thereby supply the phase-shifted local oscillation signal to the first quadrature mixers.

A multiband data communication apparatus, according to second aspect of the invention, transmits signals by switching a plurality of frequency-band in response to a band switching signal, and includes quadrature modulating means for converting a quadrature transmission baseband signal into either a transmission signal or a transmission intermediate frequency signal, the quadrature modulating means is comprising: a pair of second quadrature mixers for converting a transmission baseband signal into either the transmission signal or the transmission intermediate frequency signal; local oscillating means for producing a local oscillation signal; and phase shifting means for shifting a phase of the local oscillation signal based upon the band switching signal to thereby supply the phase-shifted local oscillation signal to the second quadrature mixers.

A multiband data communication apparatus, according to third aspect of the present invention, includes quadrature modulating means for converting a quadrature transmission baseband signal into either a transmission signal or a transmission intermediate frequency signal; quadrature demodulating means for converting either a reception signal or a reception intermediate frequency signal into a quadrature reception baseband signal; and local oscillation signal producing means for supplying a local oscillation signal to both the quadrature modulating means and the quadrature demodulating means, for transmitting/receiving by switching a plurality of frequency bands in response to a band switching signal, in that the quadrature demodulating means includes a pair of first quadrature mixers for converting either the reception signal or the reception intermediate frequency signal into a reception baseband signal; the quadrature modulating means includes a pair of second quadrature mixers for converting a transmission baseband signal into either the transmission signal or the transmission intermediate frequency signal; and the local oscillation signal producing means includes local oscillating means for producing a local oscillation signal and phase shifting means for shifting a phase of the local oscillation signal based upon the band switching signal to thereby supply the phase-shifted local oscillation signal to the first quadrature mixer and the second quadrature mixer.

Preferably, in the multiband data communication apparatus according to the above-mentioned first, second, or third aspects of the invention, the phase shifting means supplies a signal obtained by shifting the phase of the local oscillation signal by $\pi/2$ to one of the first quadrature mixers and the second quadrature mixers, while the phase shifting means supplies one of the local oscillation signal and a signal obtained by inverting a code of the local oscillation signal to the other of the first quadrature mixers and the second quadrature mixers in response to the band switching signal.

Preferably, in the multiband data communication apparatus according to the above-mentioned first, second and third aspects of the invention, the phase shifting means supplies the local oscillation signal to one mixer of the first quadrature mixers and the second quadrature mixers, while the phase shifting means supplies one of a signal obtained by shifting the phase of the local oscillation signal by $\pi/2$ and a signal obtained by shifting the phase of the local oscillation signal by $\pi/2$ and by inverting the phase-shifted local oscillation signal to the other mixer of the first quadrature mixers and the second quadrature mixers in response to the band switching signal.

Preferably, in the multiband data communication apparatus according to the above-mentioned first, second and third aspects of the invention, the phase shifting means supplies the local oscillation signal to one of the first quadrature mixers and the second quadrature mixers, while the phase shifting means supplies one of a signal obtained by delaying the phase of the local oscillation signal by $\pi/2$ and a signal obtained by advancing the phase of the local oscillation signal by $\pi/2$ to the other mixer of the first quadrature mixers and the second quadrature mixers in response to the band switching signal.

Further, a multiband data communication apparatus according to fourth aspect of the invention, receives signals by switching a plurality of frequency bands in response to a band switching signal and includes quadrature demodulating means for converting either a reception signal or a reception intermediate frequency signal into a quadrature reception baseband signal, the quadrature demodulating means comprising: a pair of first quadrature mixers for converting either the reception signal or the reception intermediate frequency signal into a reception baseband signal; storage means for saving thereinto discrete data of a frequency pattern component functioning as a base; address generating means for generating an address every preselected clock; phase shift means for adding a predetermined number based upon the band switching signal to the address; first analog converting means for analog-converting data which is read out by addressing the storage means based on the address outputted from the address generating means to thereby supply the analog-converted data to one of the first quadrature mixers; and second analog converting means for analog-converting data which is read out by addressing the storage means based on the output of the phase shift means to thereby supply the analog-converted data to the other of the first quadrature mixers.

Further, a multiband data communication according to fifth aspect of the invention, transmits signals by switching a plurality of frequency band in response to a band switching signal, and includes quadrature modulating means for converting a quadrature transmission baseband signal into either a transmission signal or a transmission intermediate frequency signal, the quadrature modulating means comprising: a pair of second quadrature mixers for converting a transmission baseband signal into either the transmission signal or the transmission intermediate frequency signal; storage means for saving thereinto discrete data of a frequency pattern component functioning as a base; address generating means for generating an address every preselected clock; phase shift means for adding a predetermined number based upon the band switching signal to the address; first analog converting means for analog-converting data which is read out by addressing the storage means based on the address outputted from the address generating means to thereby supply the analog-converted data to one of the second quadrature mixers; and second analog converting means for analog-converting data which is read out by addressing the storage means based on the output of the phase shift means to thereby supply the analog-converted data to the other of the second quadrature mixers.

Further, a multiband data communication apparatus according to sixth aspect of the invention, comprises: quadrature modulating means for converting a quadrature transmission baseband signal into either a transmission signal or a transmission intermediate frequency signal; quadrature demodulating means for converting either a reception signal or a reception intermediate frequency signal into a quadrature reception baseband signal; and local signal producing means for supplying a local oscillation signal to both the quadrature modulating means and the quadrature demodulating means, for transmitting/receiving by switching a plurality of frequency bands in response to a band switching signal, in that the quadrature demodulating means includes a pair of first quadrature mixers for converting either the reception signal or the reception intermediate frequency signal into a reception baseband signal; a pair of second quadrature mixers for converting a transmission baseband signal into either the transmission signal or the transmission intermediate frequency signal; and the local oscillation signal producing means includes: storage means for saving thereinto discrete data of a frequency pattern component functioning as a base; address generating means for generating an address every preselected clock; phase shift means for adding a predetermined number based upon the band switching signal to the address; first analog converting means for analog-converting data which is read out by addressing the storage means based on the address outputted from the address generating means to thereby supply the analog-converted data to one of the first and second quadrature mixers; and second analog converting means for analog-converting data which is read out by addressing the storage means based on the output of the phase shift means to thereby supply the analog-converted data to the other of the first and second quadrature mixers.

Preferably, in a multiband communication apparatus according to the above-mentioned fourth, fifth and sixth aspects of the invention, either the quadrature modulating means or the local oscillation signal producing means includes: clock generating means for generating a clock signal; and interval determining means for determining a clock interval used to read out data from the storage means so as to control the address generating operation of the address generating means.

According to seventh aspect of the invention, a communication method of a multiband data communication apparatus including quadrature demodulating means for converting either a reception signal or a reception intermediate frequency signal into a quadrature reception baseband signal, for receiving by switching a plurality of frequency bands in response to a band switching signal, in that the communication method comprises: a local oscillating step for producing a local oscillation signal; a phase shifting step for shifting a phase of the local oscillation signal in response to the band switching signal to thereby supply the phase-shifted local oscillation signal to a first quadrature mixer for converting either the reception signal or the reception intermediate frequency signal into a reception baseband signal.

According to the eighth aspect of the invention, a communication method of a multiband data communication apparatus including quadrature modulating means for converting a quadrature transmission baseband signal into either a transmission signal or a transmission intermediate frequency signal, for transmitting by switching a plurality of frequency band in response to a band switching signal, in that the communication method is comprised of: a local oscillating step for producing a local oscillation signal; and a phase shifting step for shifting a phase of the local oscillation signal in response to the band switching signal to thereby supply the phase-shifted local oscillation signal to a second quadrature mixer for converting a transmission baseband signal into either the transmission signal or the transmission intermediate frequency signal.

According to the ninth aspect of the inveniton, a communication method of a multiband data communication apparatus including quadrature modulating means for converting a quadrature transmission baseband signal into either a transmission signal or a transmission intermediate frequency signal; and quadrature demodulating means for converting either a reception signal or a reception intermediate frequency signal into a quadrature reception baseband signal; and for transmitting/receiving by switching a plurality of frequency bands in response to a band switching signal, in that the communication method comprises: a local oscillating step for producing a local oscillation signal; and a phase shifting step for shifting a phase of the local oscillation signal in response to the band switching signal to thereby supply the phase-shifted local oscillation signal to one of a first quadrature mixer and a second quadrature mixer, the first quadrature mixer converting either the reception signal or the reception intermediate frequency signal into a reception baseband signal, and the second quadrature mixer converting a transmission baseband signal into either the transmission signal or the transmission intermediate frequency signal.

Preferably, in the communication method according to the above-mentioned seventh, eighth, and ninth aspects of the invention, the phase shifting step includes: a first supplying step for supplying a signal which is obtained by shifting the phase of the local oscillation signal by $\pi/2$ to one of the first quadrature mixers and the second quadrature mixers; an inverting step for inverting a code of the local oscillation signal; and a second supplying step for supplying one of the local oscillation signal and the output signal of the inverting step to the other of the first quadrature mixers and the second quadrature mixers in response to the band switching signal.

Preferably, in the communication method according to the above-mentioned seventh, eighth, and ninth aspects of the phase shifting step includes: a first supplying step for supplying the local oscillation signal to one of the first quadrature mixers and the second quadrature mixers; a phase shifting step for shifting the phase of the local oscillation signal by $\pi/2$; an inverting step for inverting a code of the output signal of the phase shifting step; and a second supplying step for supplying one of the output signal of the phase shifting step and the output signal of the inverting step to the other of the first quadrature mixers and the second quadrature mixers in response to the band switching signal.

Preferably, in the communication method according to the above-mentioned seventh, eighth, and ninth aspects of the invention, the phase shifting step includes: a first supplying step for supplying the local oscillation signal to one of the first quadrature mixer and the second quadrature mixer; a phase delaying step for delaying the phase of the local oscillation signal by $\pi/2$; a phase advancing step for advancing the phase of the local oscillation signal by $\pi/2$; and a second supplying step for supplying one of the output signal of the phase delaying step and the output signal of the phase advancing step to the other of the first quadrature mixer and the second quadrature mixer in response to the band switching signal.

According tenth aspect of the invention, a communication method of a multiband data communication apparatus including quadrature demodulating means for converting either a reception signal or a reception intermediate frequency signal into a quadrature reception baseband signal, for receiving by switching a plurality of frequency bands in response to a band switching signal, in that the communication method is comprised of: a storing step for saving thereinto discrete data of a frequency pattern component functioning as a base; an address generating step for generating an address every preselected clock; a phase shifting step for adding a predetermined number based upon the band switching signal to the address; a first analog converting step for analog-converting data which is read out by addressing the storing step based on the address outputted from the address generating step to thereby supply the analog-converted data to one of first quadrature mixers for converting either the reception signal or the reception intermediate frequency signal into a reception baseband signal; and a second analog converting step for analog-converting data which is read out by addressing the storing step based on the output of the phase shifting step to thereby supply the analog-converted data to the other of the first quadrature mixers.

According to eleventh aspect of the invention, a communication method of a multiband data communication apparatus including quadrature modulating means for converting a quadrature transmission baseband signal into either a transmission signal or a transmission intermediate frequency signal, for transmitting by switching a plurality of frequency band in response to a band switching signal, in that the communication method is comprised: a storing step for saving thereinto discrete data of a frequency pattern component functioning as a base; an address generating step for generating an address every preselected clock; a phase shifting step for adding a predetermined number based upon the band switching signal to the address; a first analog converting step for analog-converting data which is read out by addressing the storing step based on the address outputted from the address generating step to thereby supply the analog-converted data to one of second quadrature mixers for converting a transmission baseband signal into either the transmission signal or the transmission intermediate frequency signal; and a second analog converting step for analog-converting data which is read out by addressing the storing step based on the output of the phase shifting step to thereby supply the analog-converted data to the other of the second quadrature mixers.

According to twelfth aspect of the invention, a communication method of a multiband data communication apparatus including quadrature modulating means for converting a quadrature transmission baseband signal into either a transmission signal or a transmission intermediate frequency signal; and quadrature demodulating means for converting either a reception signal or a reception intermediate frequency signal into a quadrature reception baseband signal; and for transmitting/receiving by switching a plurality of frequency bands in response to a band switching signal, in that the communication method is comprised of: a storing step for saving thereinto discrete data of a frequency pattern component functioning as a base; an address generating step for generating an address every preselected clock; a phase shifting step for adding a predetermined number based upon the band switching signal to the address; a first analog converting step for analog-converting data which is read out by addressing the storing step based on the address outputted from the address generating step to thereby supply the analog-converted data to one of a first quadrature mixers and a second quadrature mixers, the first quadrature mixer converting either the reception signal or the reception intermediate frequency signal into a reception baseband signal, and a second quadrature mixer converting a transmission baseband signal into either the transmission signal or the transmission intermediate frequency signal; and a second analog converting step for analog-converting data which is read out by addressing the storing step based on the output of the phase shifting step to thereby supply the analog-converted data to the other of the first quadrature mixers and the second quadrature mixers.

Furthermore, a storage medium, according to the invention, is a storage medium for storing thereinto a computer readable program used to execute the communication method of the multiband data communication apparatus as mentioned above.

In the multiband data communication apparatus according to first aspect of the invention, the communication method of the multiband data communication apparatus according to seventh aspect of the invention, when a plurality of frequency bands are switched by the band switching signal to receive the communication data, the local oscillation signal is produced by the local oscillating means (local oscillating step), and the phase of the local oscillation signal is changed in response to the band switching signal by the phase shifting means (phase shifting step). Then, the phase-shifted local oscillation signal is supplied to the first quadrature mixer for converting either the reception signal or the reception intermediate frequency signal into the reception baseband signal.

As a result, the correct reception baseband signal is obtained not depending upon the frequency band, but a desirable reception baseband signal can be obtained irrespective of the frequency relationship between the reception signal and the local oscillation signal, and then the correct demodulating process operation can be carried out in accordance with the band switching control by the band switching signal. To this end, only the phase shifting means (phase shifting step) is additionally provided as the structural element (processing step). The increase in the additionally provided circuit scale (processing step) can be suppressed to the minimum circuit scale, as compared with the conventional arrangement in which the polarity of the reception baseband signal itself is switched by the data output circuit. Therefore, such an arrangement may be suitably formed in an integrated circuit. Furthermore, since the correct demodulating process operation can be carried out in accordance with the band switching control by receiving the band switching signal, the deterioration of the reception baseband signal can be avoided. To the contrary, conventionally, the reception baseband signal is directly processed to invert the code polarities of the quadrature components.

In the multiband data communication apparatus according to second aspect of the invention, and the communication method of the multiband data communication apparatus according to eight aspect of the inention, when a plurality of frequency bands are switched by the band switching signal to transmit the communication data, the local oscillation signal is produced by the local oscillating means (local oscillating step), and the phase of the local oscillation signal is changed in response to the band switching signal by the phase shifting means (phase shifting step). Then, the phase-shifted local oscillation signal is supplied to the second quadrature mixer for converting the transmission baseband signal into either the transmission signal or the transmission intermediate frequency signal.

As a result, the correct transmission signal is obtained not depending upon the frequency band, but a desirable transmission signal, or a desirable transmission intermediate frequency signal can be obtained irrespective of the frequency relationship between the transmission signal and the local oscillation signal, and then the correct modulating process operation can be carried out in accordance with the band switching control by the band switching signal. To this end, only the phase shifting means (phase shifting step) is additionally provided as the structural element (processing step). The increase in the additionally provided circuit scale (processing step) can be suppressed to the minimum circuit scale, as compared with the conventional arrangement in which the polarity of the transmission baseband signal itself is switched by the waveform generating circuit. Therefore, such an arrangement may be suitably formed in an integrated circuit. Furthermore, since the correct demodulating process operation can be carried out in accordance with the band switching control by receiving the band switching signal, the deterioration of the transmission baseband signal can be avoided. To the contrary, conventionally, the transmission baseband signal is directly processed to invert the code polarities of the quadrature components.

In the multiband data communication apparatus according to third aspect of the invention, the communication method of the multiband data communication apparatus according to ninth aspect of the invention, when a plurality of frequency bands are switched by the band switching signal to transmit/receive the communication data, the local oscillation signal is produced by the local oscillating means (local oscillating step), and the phase of the local oscillation signal is changed in response to the band switching signal by the phase shifting means (phase shifting step). Then, the phase-shifted local oscillation signal is supplied to the first quadrature mixer for converting either the reception signal or the reception intermediate frequency signal into the reception baseband signal. Otherwise, this phase-shifted local oscillation signal is supplied to the second quadrature mixer for converting the transmission baseband signal to either the transmission signal or the transmission intermediate frequency signal.

As a result, the correct reception baseband signal and the correct transmission signal can be obtained not depending upon the frequency band, but the correct modulating/demodulating process operations can be carried out in accordance with the band switching control by the band switching signal. To this end, only the phase shifting means (phase shifting step) is additionally provided as the structural element (processing step) in the transmission system and the reception system. The increase in the additionally provided circuit scale (processing step) can be suppressed to the minimum circuit scale, as compared with the conventional arrangement in which the polarity of the reception baseband signal itself is switched by the data output circuit, and also the polarity of the transmission baseband is switched by the waveform generating circuit. Therefore, such an arrangement may be suitably formed in an integrated circuit. Furthermore, since the correct demodulating process operation can be carried out in accordance with the band switching control by receiving the band switching signal, the deteriorations of the reception baseband signal and the transmission baseband signal can be avoided. To the contrary, conventionally, the reception baseband signal and also the transmission baseband signal are directly processed to invert the code polarities of the quadrature components.

More specifically, in the phase shifting means (phase shifting step), for example, the phase shifting means (first supplying step) supplies such a signal obtained by shifting the phase of the local oscillation signal by $\pi/2$ to one mixer of the first quadrature mixers and the second quadrature mixers; the code of the local oscillation signal is inverted by the inverting means (inverting step); and the switching means (second supplying step) supplies any one of the local oscillation signal and the output signal of the inverting means (inverting step) in response to the band switching signal to the other of the first quadrature mixers and the second quadrature mixers. It should be noted that both the inverting means (inverting step) and the switching means (second supplying step) may be realized by an exclusive OR gating means (exclusive OR gating step) for exclusively OR-gating the local oscillation signal and the binary signal produced based upon the band switching signal to thereby supply the exclusively OR-gated signal to the other of the first quadrature mixers and the second quadrature mixers.

As explained above, as the structural element (processing step) used to perform the correct modulating/demodulating process operations in accordance with the band switching control by the band switching signal, only either the inverting means (inverting step) and the switching means (second supplying step) or the exclusive OR gating means (exclusive OR gating step) is employed. Therefore, the increase in the additionally provided circuit scale (processing step) can be suppressed to the minimum circuit scale, and thus, such an arrangement may be suitably formed in an integrated circuit.

More specifically, in the phase shifting means (phase shifting step), for example, the phase shifting means (first supplying step) supplies the local oscillation signal to one mixer of the first quadrature mixers and the second quadrature mixers; the phase shift means (phase shift step) shifts the phase of the local oscillation signal by $\pi/2$; the code of the output signal of the phase shift means (phase shift step) is inverted by the inverting means (inverting step); and the switching means (second supplying step) supplies any one of the output signal of the phase shift means (phase shift step) and the output signal of the inverting means (inverting step) in response to the band switching signal to the other of the first quadrature mixers and the second quadrature mixers. It should be noted that both the inverting means (inverting step) and the switching means (second supplying step) may be realized by an exclusive OR gating means (exclusive OR gating step) for exclusively OR-gating the local oscillation signal and the binary signal produced based upon the band switching signal to thereby supply the exclusively OR-gated signal to either the other of the first quadrature mixers and the second quadrature mixers.

As explained above, as the structural element (processing step) used to perform the correct modulating/demodulating process operations in accordance with the band switching control by the band switching signal, only either the inverting means (inverting step) and the switching means (second supplying step) or the exclusive OR gating means (exclusive OR gating step) is employed. Therefore, the increase in the additionally provided circuit scale (processing step) can be suppressed to the minimum circuit scale, and thus, such an arrangement may be suitably formed in an integrated circuit.

More specifically, in the phase shifting means (phase shifting step), for example, the phase shifting means (first supplying step) supplies the local oscillation signal to one of the first quadrature mixers and the second quadrature mixers; the phase delaying means (phase delaying step) delays the phase of the local oscillation signal by $\pi/2$; the phase advancing means (phase advancing step) advances the phase of the local oscillation signal; and the switching means (second supplying step) supplies any one of the output signal of the phase delaying means (phase delaying step) and the output signal of the phase advancing means (phase advancing step) in response to the band switching signal to the other of the first quadrature mixers and the second quadrature mixer.

As explained above, as the structural element (processing step) used to perform the correct modulating/demodulating process operations in accordance with the band switching control by the band switching signal, only the phase advancing means (phase advancing step) and the switching means (second supplying step) are employed. Therefore, the increase in the additionally provided circuit scale (processing step) can be suppressed to the minimum circuit scale, and thus, such an arrangement may be suitably formed in an integrated circuit.

Moreover, in the multiband data communication apparatus according fourth, fifth and sixth aspects of the invention, and the communication method of the multiband data communication apparatus according to tenth, eleventh and twelfth aspects of the invention, when the communication data is transmitted/received by switching a plurality of frequency bands in response to the band switching signal, the discrete data of the frequency pattern component functioning as a base is saved in the storage means (by storing step); the address generating means (address generating step) generates the address every preselected clock; the phase shift means (phase shift step) adds the predetermined number based upon the band switching signal to the address; the first analog converting means (first analog converting step) analog-converts the data which is read out by addressing the data saved in the storage means (storing step) based on the address outputted from the address generating means (address generating step) to thereby supply the analog-converted data to one of the first quadrature mixers and the second quadrature mixers. The first quadrature mixer converts either the reception signal or the reception intermediate frequency signal into the reception baseband signal. The second quadrature mixer converts the transmission baseband signal into either the transmission signal or the transmission intermediate frequency signal. Also, the second analog converting means (second analog converting step) analog-converts the data which is read out by addressing data saved in the storage means (storage step) in response to the output of the phase shift means (phase shift step), and thereafter supplies the analog-converted data to the other of the first quadrature mixers and the second quadrature mixers.

As previously explained, the structural element (processing step) additionally provided so as to execute the correct modulating/demodulating process operations in accordance with the band switching control by the band switching signal may be realized by, for example, a DDS (Direct Digital Synthesizer) and a DSP (Digital Signal Processor) and the like, which are additionally provided in the transmission system and the reception system. As a consequence, the increase in the additionally provided circuit scale (processing step) can be suppressed to the minimum circuit scale, as compared with the conventional arrangement in which the polarity of the transmission baseband signal is switched by the waveform generating circuit, and the polarity of the reception baseband signal is changed by the data output circuit. Therefore, such an arrangement may be suitably formed in an integrated circuit. Furthermore, since the correct demodulating process operation can be carried out in accordance with the band switching control by receiving the band switching signal, the deteriorations of the reception baseband signal and the transmission baseband signal can be avoided. To the contrary, conventionally, the transmission baseband signal and the reception baseband signal are directly processed to invert the code polarities of the quadrature components.

In the multiband data communication apparatus, in particular, the clock signal is generated by the clock generating means; and the clock interval at which the data is read out from the storage means is determined by the interval determining means so as to control the address generation by the address generating means. As a result, it is possible to arbitrarily control the frequency of the local oscillation signal generated from the local oscillation signal-generating means, in the quadrature demodulating means, or the quadrature modulating means.

BRIEF DESCRIPTION OF THE PREFERRED EMBODIMENTS

DETAILED DESCRIPTION OF THE PREFERRED EMBODIMENTS

Referring now to drawings, a description will be made of various embodiment modes related to a multiband data communication apparatus, a communication method of a multiband data communication apparatus, and also a storage medium of the present invention, while sequentially explaining first to eleveth emobidments in detail in combination with modifications. It should be understood that in the descriptions of the respective embodiment modes, the multiband data communication apparatus and the communication method of the multiband data communication apparatus, according to the present invention, will be described in detail. However, since the storage medium according to the present invention is equal to such a storage medium for storing thereinto a program used to execute the above-described communication method of the multiband data communication apparatus, a description thereof is involved in the below-mentioned explanations as to the communication method of the multiband data communication apparatus.

First Embodiment

Figure 1:
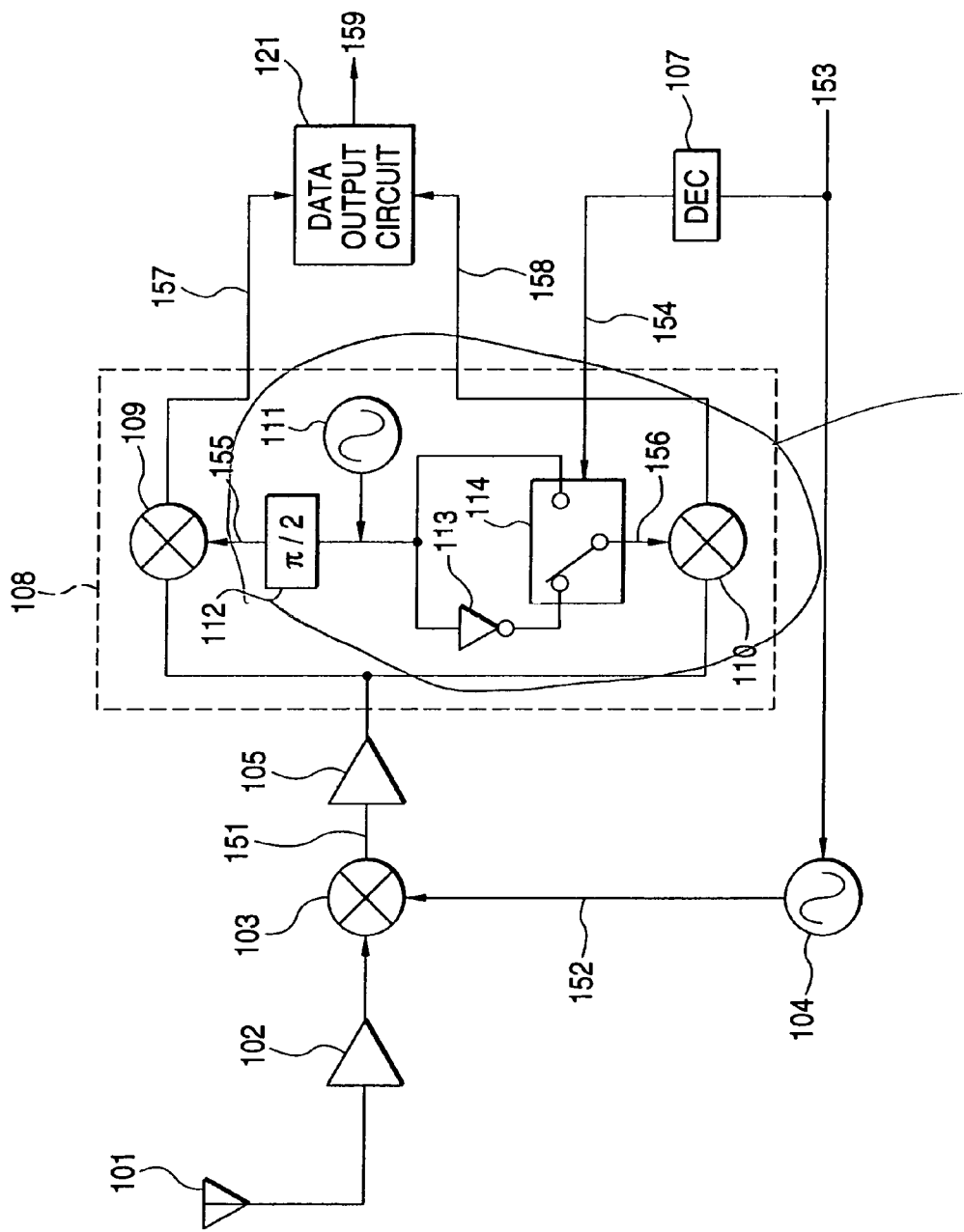
FIG. 1 is a structural diagram of a multiband data communication apparatus according to a first embodiment mode of the present invention.

FIG. 1 is a structural diagram for indicating either a multiband data communication apparatus or a multiband data communication apparatus to which a communication method is applied, according to a first embodiment mode of the present invention. This first embodiment mode is such a multiband data communication apparatus for receiving by switching a plurality of frequency bands in response to a band switching signal, namely is directed to a data communication apparatus such as a mobile communication apparatus which is typically known as a digital portable telephone and a paging receiver.

In FIG. 1, the multiband data communication apparatus, according to this first embodiment mode, is arranged by employing an antenna 101, an radio frequency amplifier 102, a downconverter 103, a local oscillator 104, an intermediate frequency amplifier 105, a quadrature demodulator 108, and also a data output circuit 121. The antenna 101 is used to effectively receive a reception signal. The radio frequency (high frequency) amplifier 102 amplifies the received radio frequency signal under low noise condition. The downconverter 103 converts the radio frequency signal into an intermediate frequency signal 151. The local oscillator 104 oscillates a local oscillation signal 152 which is entered into the downconverter 103. The intermediate frequency amplifier 105 amplifies the intermediate frequency signal converted by the downconverter 103. The quadrature demodulator 108 converts the amplified intermediate frequency signal into both a reception baseband signal 157 and another reception baseband signal 158. The data output circuit converts the reception baseband signals 157 and 158 into reception data 159.

Also, in FIG. 1, the quadrature demodulator 108 is arranged by employing quadrature mixers (first quadrature mixers) 109 and 110; a reception local oscillator (local oscillating means) 111; a phase shifter 112; an inverter circuit 113; and also a switch circuit 114. The quadrature mixers 109 and 110 convert the entered reception intermediate frequency signal into both the reception baseband signals 157 and 158. The reception local oscillator 111 oscillates a reception local oscillation signal (local oscillation signal) which is entered into the quadrature mixers 109 and 110. The phase shifter 112 shifts the phase of the reception local oscillation signal. The inverter circuit 113 inverts the code of the reception local oscillation signal. The switch circuit 114 selects that which reception local oscillation signal should be entered into the quadrature mixer 110 among a polarity of reception local oscillation signals having different phases from each other.

In this case, the phase shifter 112, the inverter circuit 113, and the switch circuit 114 correspond to a phase shifting means. The inverter circuit may be realized by an inverting amplifier and the like. The switch circuit 114 may be realized by an analog switch made of a switching element. Also, a DEC 107 additionally provided with the quadrature demodulator 108 corresponds to a decode for decoding the band switching circuit 153 to thereby produce a switching signal 154 of the switch circuit 114.

Generally speaking, in the multiband data communication apparatus equipped with the above-described arrangement, assuming now that orthogonal baseband signal components are I(t) and Q(t), and an angular frequency of a carrier wave is "ωRF", a reception signal SRF(t) received from the antenna 101 may be expressed by the following formula (1):

$$SRF(t)=I(t)\cos[\omega RFt]+Q(t)\sin[\omega RFt] \qquad (1)$$

It should be noted that a coefficient of an amplitude which is equally applied to the respective terms of the below-mentioned formulae is negligible.

Also, assuming now that an angular frequency of the local oscillation signal 152 is "ωL0" and an arbitrary phase difference is "ØL0", an output signal "SL0(t)" of the local oscillator 104 which is entered into the downconverter 103 is expressed by the following formula (2):

$$SL0(t)=\cos[\omega L0t+\text{Ø}L0] \qquad (2)$$

In the downconverter 103, the reception signal SRF(t) is multiplied by the local oscillation signal SL0(t), so that an output SMIX(t) of the downconverter 103 is given by the following formula (3):

$$\begin{aligned} SMIX(t) &= SL0(t) \cdot SRF(t) \qquad (3)\\ &= \cos[\omega L0t + \text{Ø}L0] \cdot \{I(t)\cos[\omega RFt] + Q(t)\sin[\omega RFt]\}\\ &= I(t)\{\cos[(\omega L0 + \omega RF)t + \text{Ø}L0] +\\ &\quad \cos[(\omega L0 - \omega RF)t + \text{Ø}L0]\} +\\ &\quad Q(t)\{\sin[(\omega L0 + \omega RF)t + \text{Ø}L0] -\\ &\quad \sin[(\omega L0 - \omega RF)t + \text{Ø}L0]\} \end{aligned}$$

Also, since the term of "ωL0+ωRF" of the output of the downconverter 103 corresponding to the high frequency component is negligible in either the low-pass filter or the high-pass filter, when ωL0>ωRF, the reception intermediate frequency signal 151 may be expressed by employing this angular frequency ωIF (=ωL0−ωRF):

$$SIF(t) = I(t)\cos[\omega IFt + \emptyset L0] - Q(t)\sin[\omega IFt + \emptyset L0] \quad (4)$$

In the quadrature demodulator 108, the reception baseband signals 157 and 158 are obtained by multiplying this reception intermediate frequency signal SIF(t) by the reception local oscillation signals 155 and 156 whose phase difference is 90 degrees. Assuming now that the reception baseband signals 157 and 158 correspond to "a(t)" and "b(t)", respectively, the first baseband signal "a(t)" is expressed as follows:

$$a(t) = SIF(t)\cos[\omega IFt + \emptyset IF] \quad (5)$$
$$= \{I(t)\cos[\omega IFt + \emptyset L0] - Q(t)\sin[\omega IFt + \emptyset L0]\} \cdot \cos[\omega IFt + \emptyset IF]$$
$$= I(t)\{\cos[2\omega IFt + \emptyset L0 + \emptyset IF] + \cos[\emptyset L0 - \emptyset IF]\} -$$
$$Q(t)\{\sin[2\omega IFt + \emptyset L0 + \emptyset IF] + \sin[\emptyset L0 - \emptyset IF]\}$$

In this case, since the baseband component is derived by neglecting the high frequency component, the reception baseband signal "a(t)" is eventually given as:

$$a(t) = I(t)\cos[\emptyset BB] + Q(t)\sin[\emptyset BB] \quad (6)$$

In this formula, it is assumed that ØBB=ØIF−ØL0.

Similarly, since the other reception baseband signal "b(t)" is equal to SIF(t) sin [ωIFt+ØIF], this baseband signal "b(t)" is expressed as follows:

$$b(t) = I(t)\sin[\emptyset BB] + Q(t)\cos[\emptyset BB] \quad (7)$$

While utilizing the quadrature characteristic of the signals, the respective components I(t) and Q(t) can be derived.

For instance, if cos[ØBB]=1, then the baseband signals "a(t)" and "b(t)" are given as follows:

$$a(t) = I(t) \quad (8)$$
$$b(t) = -Q(t) \quad (9).$$

This is directly related to the orthogonal baseband signal itself.

In this case, it is set that ωL0>ωRF. However, such a frequency relationship cannot always be established in such a circuit arrangement capable of handling a plurality of frequency bands called as either "dual band" or "multiband". In other words, in a certain frequency band, the frequency relationship ωL0>ωRF may be established and thus, the above-explained formulae can be calculated. However, considering now that another frequency relationship ωL0<ωRF is established in another frequency band, since ωIF=ωRF−ØL0, the following formulae are given as follows:

$$SIF2(t) = I(t)\cos[\omega IFt - \emptyset L0] + Q(t)\sin[\omega IFt - \emptyset L0] \quad (10)$$

$$a2(t) = I(t)\cos[\emptyset BB2] - Q(t)\sin[\emptyset BB2] \quad (11)$$

$$b2(t) = I(t)\sin[\emptyset BB2] - Q(t)\cos[\emptyset BB2] \quad (12)$$

As a result, if cos [ØBB2]=1, then the baseband signals "a2(t)" and "b2(t)" are given as follows:

$$a2(t) = I(t) \quad (13),$$
$$b2(t) = Q(t) \quad (14).$$

Therefore, reception baseband signals whose phase relations are different from each other are obtained.

In such a case, in the quadrature demodulator 108, the polarity of the switch circuit 114 is switched by employing the band switching signal 153. As a result, the below-mentioned formulae are given:

$$b2(t) = SIF2(t)\{-\sin[\omega IFt + \emptyset L0]\} \quad (15)$$
$$= \{I(t)\cos[\omega IFt - \emptyset L0] + Q(t)\sin[\omega IFt - \emptyset L0]\} \cdot$$
$$\{-\sin[\omega IFt + \emptyset L0]\}$$
$$= \{I(t)\sin[2\omega IFt - \emptyset L0 + \emptyset IF] + \sin[\emptyset L0 + \emptyset IF]\} +$$
$$\{Q(t)\cos[2\omega IFt - \emptyset L0 + \emptyset IF] + \cos[\emptyset L0 + \emptyset IF]\}$$

In this formula, if the high frequency component, namely the term of 2ωIF is neglected, then the baseband signal "b2(t)" is given as follows:

$$b2(t) = -I(t)\sin[\emptyset BB2] - Q(t)\cos[\emptyset BB2] \quad (16)$$

If cos[ØBB2]=1, then it is given as follows:

$$b2(t) = -Q(t) \quad (17)$$

As a consequence, the same reception baseband signals may be obtained irrespective of the frequency relationship between the reception signal and the local oscillation signal.

It should be noted that as a modification of this first embodiment mode, the phase shifter 112, the inverter circuit 113, and the switch circuit 114 employed in the quadrature demodulator 108 may be arranged by a DSP (digital signal processor) and the like, and these circuit elements may be realized as processing steps of a computer program executed by this DSP.

In other words, this modification is operated as follows: At a first supplying step corresponding to the phase shifter 112, such a signal obtained by shifting the phase of the reception local oscillation signal by π/2 is supplied via a D/A converter to the quadrature mixer 109. At an inverting step corresponding to the inverter circuit 113, the code polarity of the reception local signal is inverted. At a second supplying step corresponding to the switch circuit 114, any one of the reception local oscillation signal and the reception local oscillation signal inverted at the inverting step is switched in response to the band switching signal 153, and then the switched signal is supplied via a D/A converter to the quadrature mixer 110.

As previously described, in accordance with the multi-band data communication apparatus and also the communication method of the multiband data communication apparatus, according to this first embodiment mode, since the phase of the reception local oscillation signal is changed in response to the band switching signal 153, to thereby be supplied to both the quadrature mixers 109 and 110, the same reception baseband signal can be obtained irrespective of the frequency relationship between the reception signal and the local oscillation signal.

Moreover, in the quadrature demodulator 108, such a signal produced by shifting the phase of the reception local oscillation signal by π/2 by the phase shifter 112 is supplied to the quadrature mixer 109. The switch circuit 114 supplies to the quadrature mixer 110, any one of the reception local oscillation signal which is switched in response to the band switching signal 153, and the reception local signal whose code polarity is inverted by the inverter circuit 113. As previously explained, only the inverter circuit 113 and the switch circuit 114 are employed as the structural elements which are additionally provided so as to execute the correct demodulating process operation in accordance with the band switching control by the band switching signal 153. As a result, the increase in the additionally provided circuit scale can be suppressed, and also the entire circuit arrangement can be suitably formed in an integrated circuit, as compared with such a conventional circuit arrangement that the polarity of the reception baseband signal itself is switched by the data output circuit.

Furthermore, since the correct demodulating process operation can be carried out in accordance with the band switching control by receiving the band switching signal 153, the deteriorations of the reception baseband signals 157 and 158 can be avoided. To the contrary, conventionally, the reception baseband signal is directly processed to invert the code polarities of the quadrature components.

Second Embodiment

Figure 2:
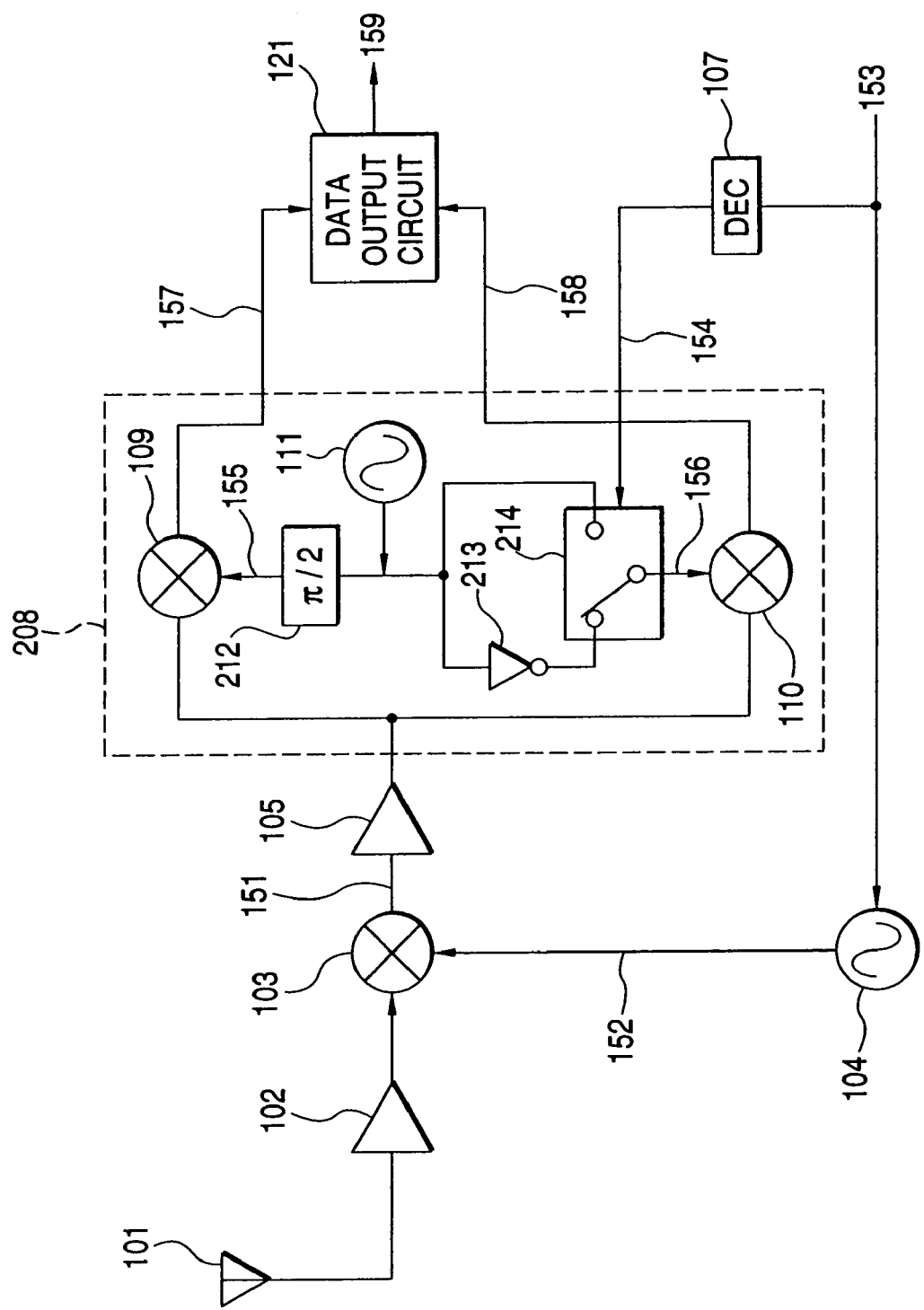
FIG. 2 is a structural diagram of a multiband data communication apparatus according to a second embodiment mode of the present invention.

Next, FIG. 2 is a structural diagram of a multiband data communication apparatus to which either a multiband data communication apparatus or a communication method, according to a second embodiment mode of the present invention, is applied. It should be noted that the same reference numerals shown in FIG. 1 (first embodiment mode) will be employed as those for denoting the same, or similar circuit elements of this drawing, and descriptions thereof are omitted.

In the first embodiment mode, the phase of the reception local oscillation signal entered into the quadrature mixer 110 is switched so as to obtain the same reception baseband signals irrespective of the frequency relationship between the reception signal and the reception local oscillation signal. To achieve the same effect as that of the first embodiment mode, reception local oscillation signals whose phases are made different from each other are entered into both the quadrature mixers 109 and 110, and furthermore, a phase relationship between these phases of the reception local oscillation signals is switched in response to the band switching signal 153. In other words, as to the quadrature demodulator 108 employed in the first embodiment mode of FIG. 1, the quadrature demodulator of this second embodiment mode may be realized by changing the position of the phase shifter 112 into such a position (212) shown in FIG. 2.

Also, in FIG. 2, a quadrature demodulator 208 is arranged by employing quadrature mixers (first quadrature mixers) 109 and 110; a reception local oscillator (local oscillating means) 111; a phase shifter 212; an inverter circuit 213; and also a switch circuit 214. The reception local oscillator 111 oscillates a reception local oscillation signal (local oscillation signal). The phase shifter 212 shifts the phase of the reception local oscillation signal. The inverter circuit 213 inverts the reception local oscillating signal. The switch circuit 214 selects that which reception local oscillation signal should be entered into the quadrature mixer 110 among a plurality of reception local oscillation signals having different phases from each other.

Similar to the first embodiment mode, it should be understood that as a modification of this second embodiment mode, the phase shifter 212, the inverter circuit 213, and the switch circuit 214 employed in the quadrature demodulator 208 may be arranged by a DSP (digital signal processor) and the like, and these circuit elements may be realized as processing steps of a computer program executed by this DSP.

In other words, this modification is operated as follows: At a first supplying step, the reception local oscillation signal is supplied via a D/A converter to the quadrature mixer 109. At a phase shift step corresponding to the phase shifter 212, the phase of the reception local signal is shifted by $\pi/2$. At an inverting step corresponding to the inverter circuit 213, the code polarity of the output signal of the phase shift step is inverted. At a second supplying step corresponding to the switch circuit 214, any one of the output signal of the phase shift step and the output signal of the inverting step is switched in response to the band switching signal 153 to thereby be supplied via a D/A converter to the quadrature mixer 110.

As previously described, in accordance with the multiband data communication apparatus and also the communication method of the multiband data communication apparatus, according to this second embodiment mode, in the quadrature demodulator 208, the reception local oscillating signal is supplied to the quadratuer mixer 109, and the switch circuit 214 switches the signal obtained by shifting the phase of the reception local oscillation signal by $\pi/2$ by the phase shifter 212, or the signal produced by inverting the code polarity of the output signal from the phase shifter 212 by the inverter circuit 213 in response to the band switching signal 153. Then, the switching circuit 214 supplies such a switched signal to the quadrature mixer 110. As previously explained, only the inverter circuit 213 and the switch circuit 214 are employed as the structural elements which are additionally provided so as to execute the correct demodulating process operation in accordance with the band switching control by the band switching signal 153. As a result, the increase in the additionally provided circuit scale can be suppressed, and also the entire circuit arrangement can be suitably formed in an integrated circuit, as compared with such a conventional circuit arrangement that the polarity of the reception baseband signal itself is switched by the data output circuit. Also, similar to the first embodiment mode, there is such an effect that the deteriorations in the reception baseband signals 157 and 158 can be prevented.

Third Embodiment

Figure 3:
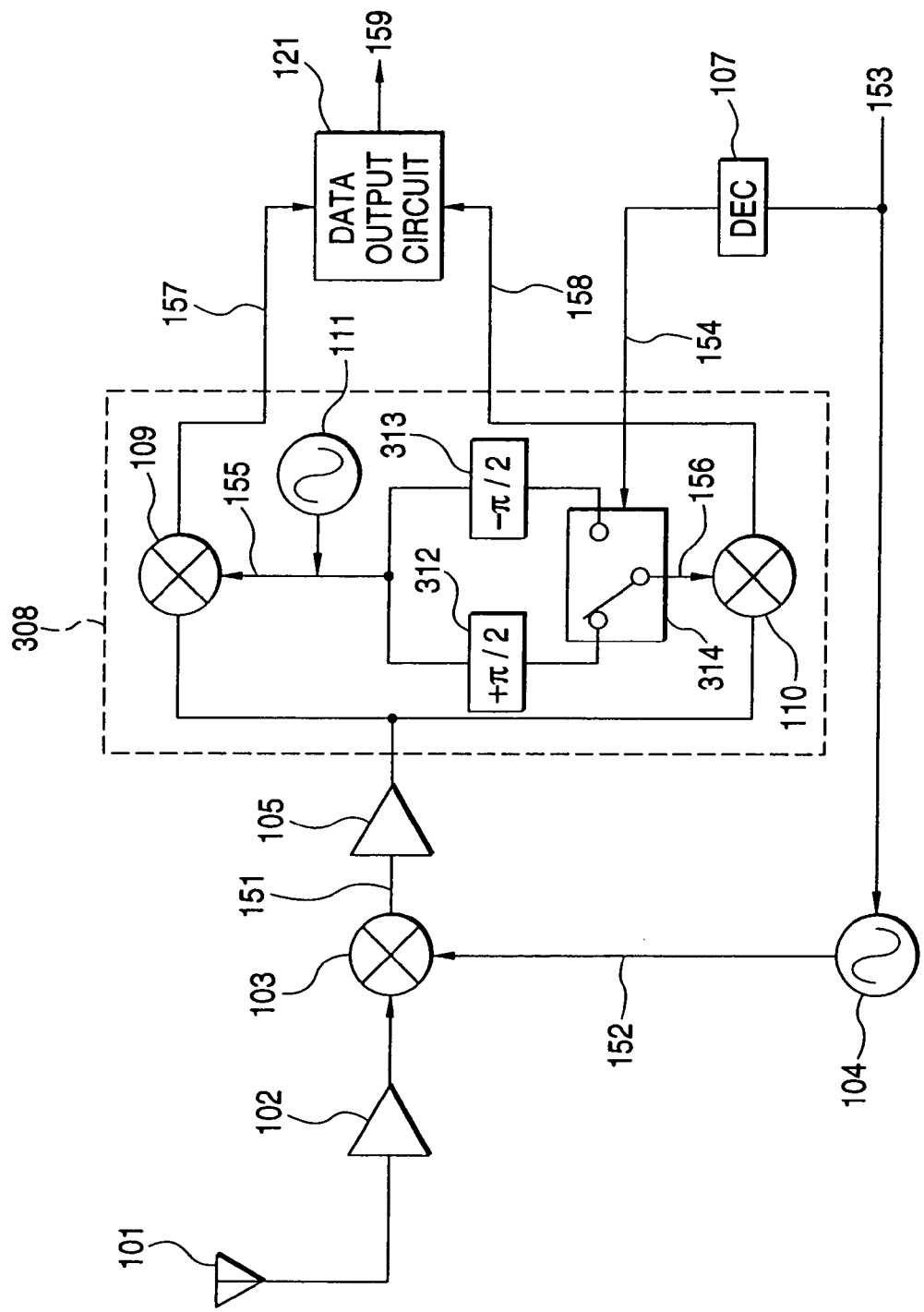
FIG. 3 is a structural diagram of a multiband data communication apparatus according to a third embodiment mode of the present invention.

Next, FIG. 3 is a structural diagram of a multiband data communication apparatus to which either a multiband data communication apparatus or a communication method, according to a third embodiment mode of the present invention, is applied. It should be noted that the same reference numerals shown in FIG. 1 (first embodiment mode) will be employed as those for denoting the same, or similar circuit elements of this drawing, and descriptions thereof are omitted. To achieve the same effect as that of the first embodiment mode, in a quadrature demodulator 308 according to this third embodiment mode, a switch circuit 314 switches an output signal derived from a phase shifter 312 and another output signal derived from another phase shifter 313, the phase change amounts of which are different from each other.

Also, in FIG. 3, the quadrature demodulator 308 is arranged by employing quadrature mixers (first quadrature mixers) 109 and 110, a reception local oscillator (local oscillating means) 111; the phase shifters 312 and 313; and also the switch circuit 314. The reception local oscillator 111 oscillates a reception local oscillation signal (local oscillation signal). The phase shifters 312 and 313 shift the phase of the reception local oscillation signal. The switch circuit 314 selects that which reception local oscillation should be entered into the quadrature mixer 110 among a polarity of reception local oscillation signals having different phases from each other.

Similar to the first embodiment mode, it should also be noted that as a modification of this third embodiment mode, the phase shifters 312 and 313, and the switch circuit 314 employed in the quadrature demodulator 308 may be arranged by a DSP (digital signal processor) and the like, and these circuit elements may be realized as processing steps of a computer program executed by this DSP.

In other words, at a first supplying step, the reception local oscillation signal is supplied via a D/A converter to the quadrature mixer 109, and at a phase delaying step corresponding to the phase shifter 312, the phase of the reception local oscillation signal is delayed by $\pi/2$, whereas at a phase advancing step corresponding to the phase shifter 313, the phase of the reception local oscillation signal is advanced by $\pi/2$. Then, at a second supplying step corresponding to the switch circuit 314, any one of the output signal obtained at the phase delaying step and the output signal obtained at the phase advancing step is switched in response to the band switching signal 153 to thereby be supplied via a D/A converter to the quadrature mixer 110.

As previously explained, in the multiband data communication apparatus and the communication method of the multiband data communication apparatus, according to this third embodiment mode, in the quadrature demodulator 308, the reception local oscillation signal is supplied to the quadrature mixer 109. The switch circuit 314 switches any one of the signal obtained by delaying the phase of the reception local oscillation signal by $\pi/2$ by the phase shifter 312, and also the signal obtained by advancing the phase of the reception local signal by the phase shifter 313 in response to the band switching signal 153. Then, the switch circuit 314 supplies the selected signal to the quadrature mixer 110. As previously explained, only the phase shifter 313 and the switch circuit 314 are employed as the structural elements which are additionally provided so as to execute the correct demodulating process operation in accordance with the band switching control by the band switching signal 153. As a result, the increase in the additionally provided circuit scale can be suppressed, and also the entire circuit arrangement can be suitably formed in an integrated circuit, as compared with such a conventional circuit arrangement that the polarity of the reception baseband signal itself is switched by the data output circuit. Also, similar to the first embodiment mode, there is such an effect that the deteriorations in the reception baseband signals 157 and 158 can be prevented.

Fourth Embodiment

Figure 4:
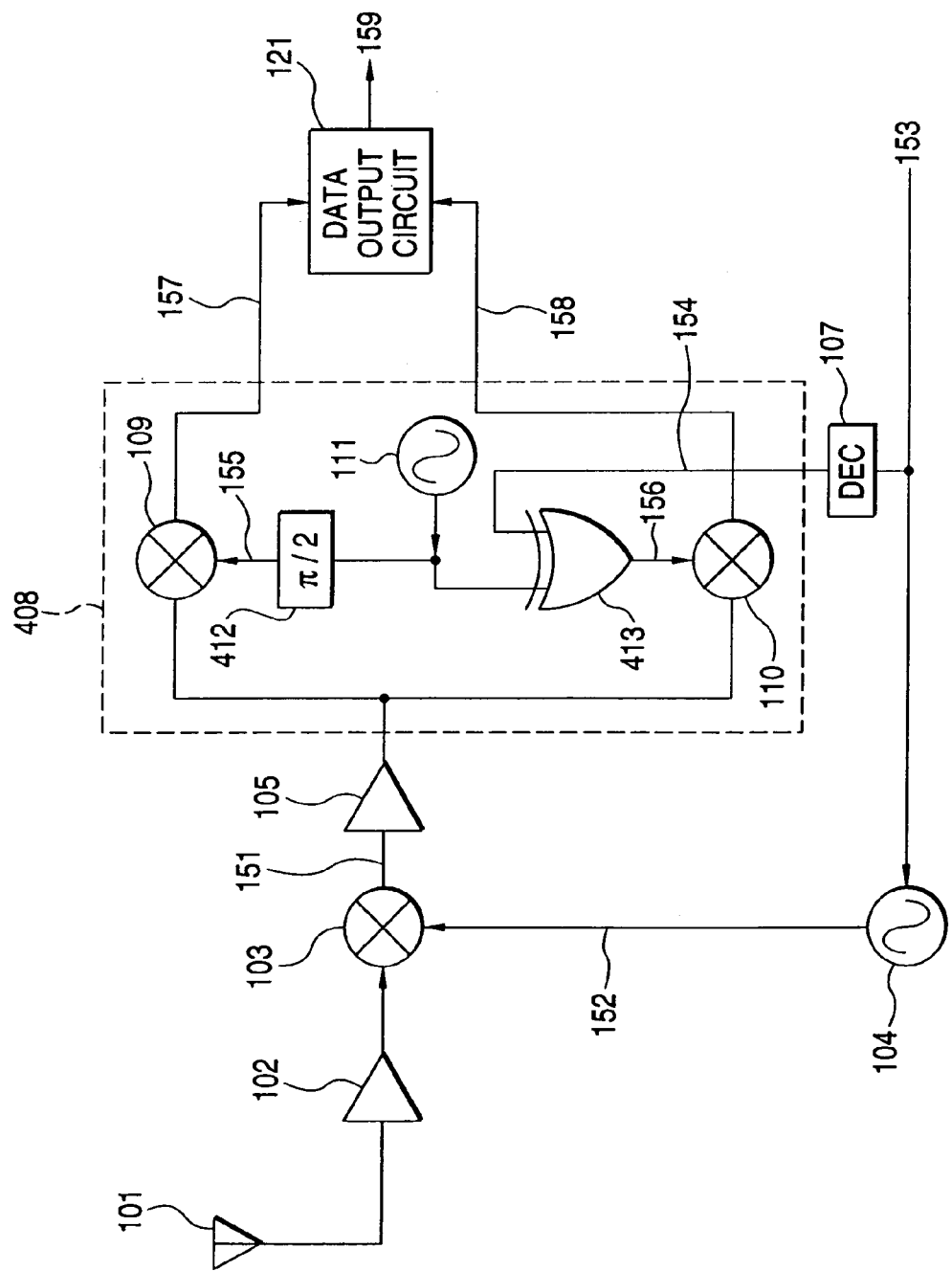
FIG. 4 is a structural diagram of a multiband data communication apparatus according to a fourth embodiment mode of the present invention.

Next, FIG. 4 is a structural diagram of a multiband data communication apparatus to which either a multiband data communication apparatus or a communication method, according to a fourth embodiment mode of the present invention, is applied. It should be noted that the same reference numerals shown in FIG. 1 (first embodiment mode) will be employed as those for denoting the same, or similar circuit elements of this drawing, and descriptions thereof are omitted. This fourth embodiment mode is featured by that in the quadrature demodulator 108 of the first embodiment mode, both the inverter circuit 113 and the switch circuit 114 are replaced by an exclusive OR gate circuit 413.

In FIG. 4, in a quadrature demodulator 408 according to this fourth embodiment mode, both a reception local oscillation signal and a decoded result (digital binary signal) 154.of a band switching signal 153 are entered into the exclusive OR gate circuit 413. In response to the value of the decoded result 154 of the band switching signal, the exclusive OR gate circuit 413 inverts the reception local oscillation signal to output the inverted reception local oscillation signal to the quadrature mixer 110, or directly outputs the reception local oscillation signal to this quadrature mixer 110. As a result, even when such a circuit arrangement is employed, it is possible to achieve a similar effect to that of the first embodiment mode.

Similar to the first embodiment mode, it should also be understood that as a modification of this first embodiment mode, a phase shifter 412, and the exclusive OR gate circuit 413 employed in the quadrature demodulator 408 may be arranged by a DSP (digital signal processor) and the like, and these circuit elements may be realized as processing steps of a computer program executed by this DSP. That is to say, at a first supplying step corresponding to the phase shifter 412, such a signal obtained by shifting the phase of the reception local oscillation signal by $\pi/2$ is supplied via a D/A converter to the quadrature mixer 109. At an exclusive OR-gating step corresponding to the exclusive OR gate circuit 413, such a signal obtained by exclusively OR-gating both the reception local oscillation signal and the decoded result 154 of the band switching signal 153 is supplied via a D/A converter to the quadrature mixer 110.

Also, similar to the modifications related to the first embodiment mode and the second embodiment mode, the position of the phase shifter 412 may be changed into such a position (indicated by 212) shown in FIG. 2. Also, even when the circuit arrangement having such a changed structure is realized as processing steps of a program executed by the DSP, a similar effect may be apparently achieved.

Fifth Embodiment

Figure 5:
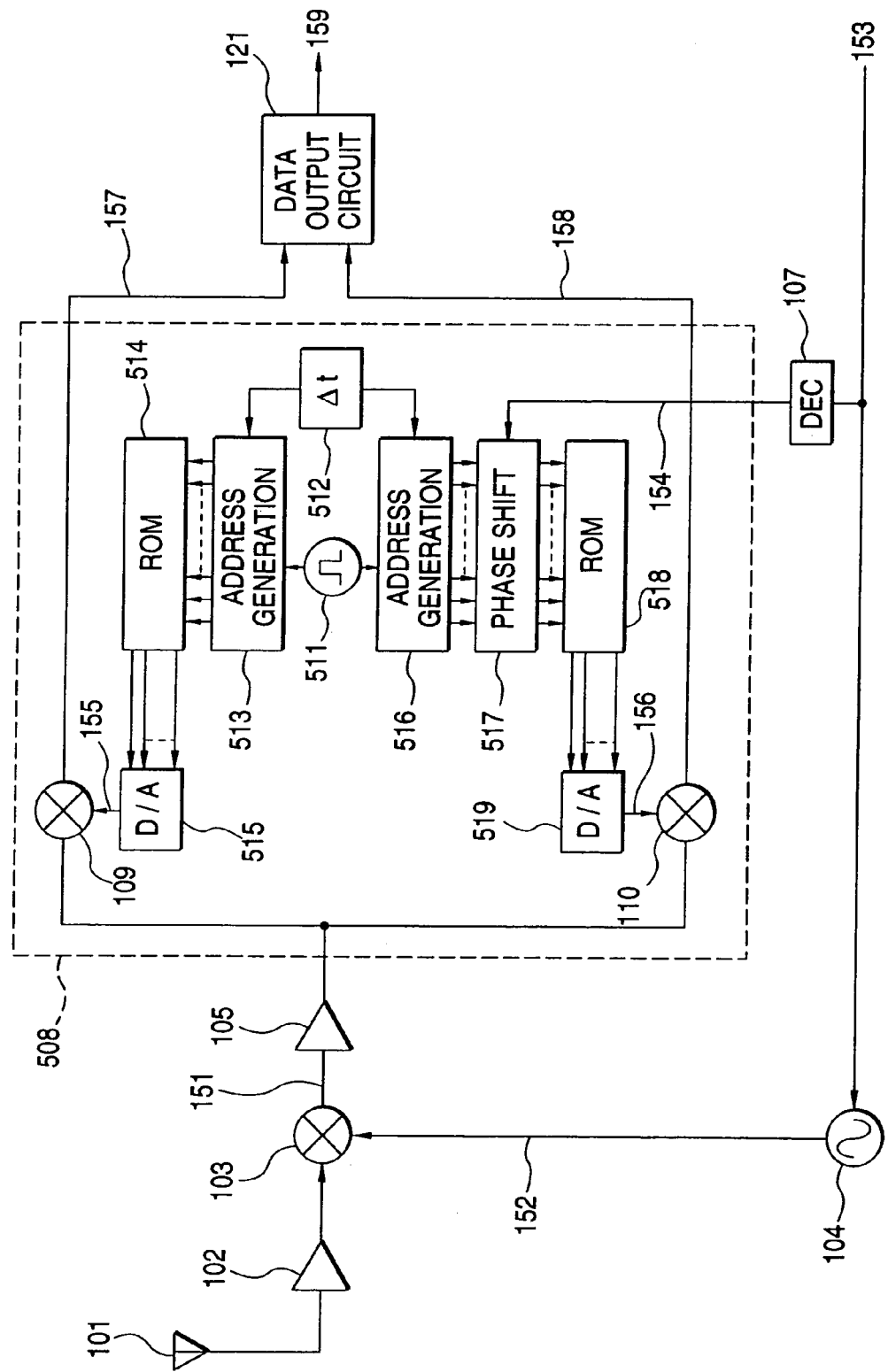
FIG. 5 is a structural diagram of a multiband data communication apparatus according to a fifth embodiment mode of the present invention.

Next, FIG. 5 is a structural diagram of a multiband data communication apparatus to which either a multiband data communication apparatus or a communication method, according to a fifth embodiment mode of the present invention, is applied. It should be noted that the same reference numerals shown in FIG. 1 (first embodiment mode) will be employed as those for denoting the same, or similar circuit elements of this drawing, and descriptions thereof are omitted. This fifth embodiment mode is featured by that a DDS is employed as a means for producing a reception local oscillation signal in a quadrature demodulator.

In FIG. 5, a quadrature demodulator 508 is arranged by employing: quadrature mixers (first quadrature mixers) 109 and 110 for converting a reception intermediate frequency signal into a reception baseband signal; memories 514 and 528 (storage means) for saving thereinto discrete data of a frequency pattern component functioning as a base; address generating units 513 and 516 for generating an address every preselected clock; a phase shift unit 517 for adding a predetermined number based upon the band switching signal 153 to the address so as to shift a phase; a D/A converting unit (first analog converting means) 515 for analog-converting data which is read out by addressing the memory 574 based on the address outputted from the address generating unit 513 to thereby supply the analog-converted data to one set of the quadrature mixer 109; and another D/A converting unit (second analog converting means) 519 for analog-converting data which is read out by addressing the memory 518 based on the output of the phase shift unit 517 to thereby supply the analog-converted data to the quadrature mixer 110. The predetermined number is such a number used to advance a phase of a signal 156 by π/2, or to delay the phase of this signal 156 by π/2.

Also, the quadrature demodulator 508 is comprised of: a clock generating unit 511 for generating a clock signal; and an interval determining unit 512 for determining a clock interval "Δt" used to read out data from the memories 514 and 518 so as to control the address generating operation of the address generating units 513 and 516. Since this clock interval "Δt" of the interval determining unit 512 is set, the frequency of the produced reception local oscillation signal can be arbitrarily controlled. It should also be noted that a DEC 107 provided with the quadrature demodulator 508 is such a decoder which decodes the band switching signal 153 so as to produce a control signal 154 to the phase shift unit 517.

Similar to the first embodiment mode, it should be noted that as a modification of this fifth embodiment mode, the DDS portion except for the quadrature mixers 109 and 110 employed in the quadrature demodulator 508 may be arranged by a DSP (digital signal processor) and the like, and these circuit elements may be realized as processing steps of a computer program executed by this DSP.

In other words, the communication method of the multi-band data communication apparatus, according to the fifth embodiment, is realized by employing: a storing step for saving discrete data of a frequency pattern component functioning as a base into the memories 514 and 518; an address generating step for generating an address every preselected clock; a phase shifting step for adding a predetermined number based upon the band switching signal 153 to the address; a first analog converting step for analog-converting data which is read out by addressing the data saved in the memory 514 based on the address outputted from the address generating step to thereby supply the analog-converted data to the quadrature mixer 109; and a second analog converting step for analog-converting data which is read out by addressing the data saved in the memory 518 based on the output of the phase shifting step to thereby supply the analog-converted data to the quadrature mixer 110. The address generating step corresponds to the address generating units 513 and 516. The phase shifting step corresponds to the phase shifting unit 517. The predetermined number is such a number used to advance the phase of the signal 156 by π/2, or to delay the phase of this signal 156 by π/2. The first analog converting step corresponds to the D/A converting unit 515. The second analog converting step corresponds to the D/A converting unit 519.

As previously described, in accordance with the multi-band data communication apparatus and also the communication method of the multiband data communication apparatus, according to this fifth embodiment mode, since the phase of the reception local oscillation signal is changed in response to the band switching signal 153 to thereby be supplied to the quadrature mixer 110, the same reception baseband signals can be obtained irrespective of the frequency relationship between the reception signal and the local oscillation signal.

Moreover, in the quadrature demodulator 508, the structural elements (processing steps) additionally provided so as to perform the correct demodulating process operation in accordance with the band switching control by receiving the band switching signal 153 may be realized by either the DDS or the DSP. As a result, the increase in the additionally provided circuit scale (processing step) can be suppressed, and also the entire circuit arrangement can be suitably formed in an integrated circuit, as compared with such a conventional circuit arrangement. Also, similar to the first embodiment mode, there is such an effect that the deteriorations in the reception baseband signals 157 and 158 can be prevented.

Sixth Embodiment

Figure 6:
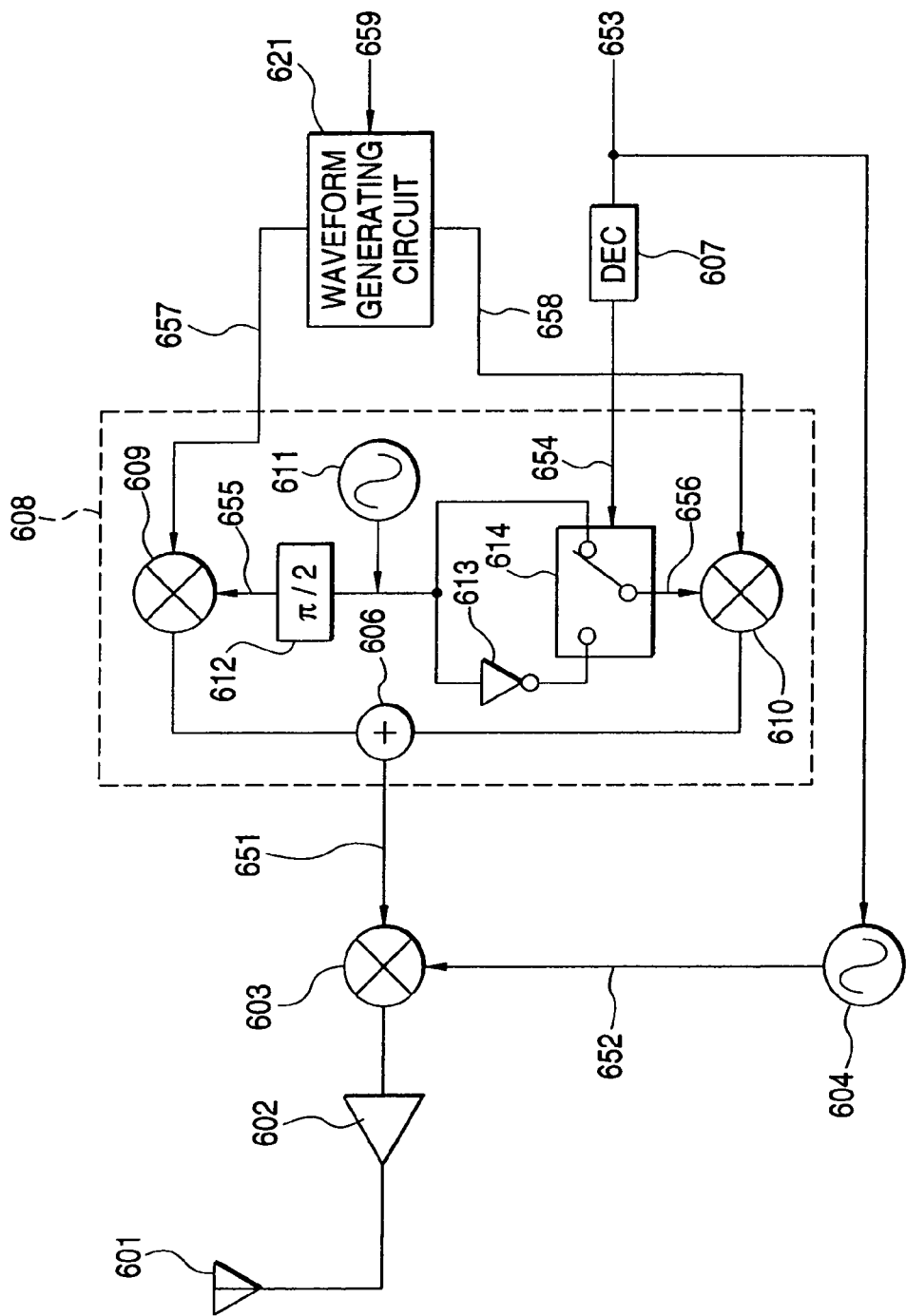
FIG. 6 is a structural diagram of a multiband data communication apparatus according to a sixth embodiment mode of the present invention.

FIG. 6 is a structural diagram for indicating either a multiband data communication apparatus or a multiband data communication apparatus to which a communication method is applied, according to a sixth embodiment mode of the present invention. This sixth embodiment mode is such a multiband data communication apparatus for transmitting by switching a plurality of frequency bands in response to a band switching signal, namely is directed to a data communication apparatus such as a mobile communication apparatus which is typically known as a digital portable telephone.

In FIG. 6, the multiband data communication apparatus, according to this sixth embodiment mode, is arranged by employing an antenna 601, a power amplifier 602, an upconverter 603, a local oscillator 604, a quadrature modulator 608, and also a waveform generating circuit 621. The waveform generating circuit 621 converts transmission data 659 into transmission baseband signals 657 and 658 orthogonal to each other. The quadrature modulator 608 outputs a transmission intermediate frequency signal 651 which correspond to the entered transmission baseband signals 657 and 658. The local oscillator 604 produces a local oscillation signal 652. The upconverter 613 enters thereinto both the transmission intermediate frequency signal 651 and the local oscillation signal 652, and then outputs a transmission signal. The (high power) power amplifier 602 amplifies the transmission signal. The antenna 601 effectively transmits the amplified transmission signal.

Also, in FIG. 6, the quadrature modulator 608 is arranged by employing quadrature mixers (second quadrature mixers) 609 and 610; a transmission local oscillator (local oscillating means) 611; a phase shifter 612; an inverter circuit 613; and also a switch circuit 614. The quadrature mixers 609 and 610 convert the entered transmission baseband signals 657 and 658 into the transmission baseband intermediate frequency signals.

In this case, the phase shifter 612, the inverter circuit 613, and the switch circuit 614 correspond to a phase shifting means. The inverter circuit 613 may be realized by an inverting amplifier and the like. The switch circuit 614 may be realized by an analog switch made of a switching element. Also, a DEC 607 additionally provided with the quadrature modulator 608 corresponds to a decoder for decoding a band switching circuit 653 to thereby produce a switching signal 654 of the switch circuit 614.

In the multiband communication apparatus with employment of the above-explained circuit arrangement, generally speaking, in the waveform generating circuit 621, assuming now that the transmission baseband signals 657 and 658 which own an orthogonal phase relationship between them and are produced from the transmission data 659 are expressed as an "I(t)" and a "Q(t)", respectively, and also an angular frequency of a local oscillation signal outputted from the transmission local oscillator 611 is equal to "ωIF", the transmission intermediate frequency signal 651 may be expressed as follows:

$$SIF(t)=I(t)\cos[\omega IFt]+Q(t)\sin[\omega IFt] \quad (18)$$

It should be noted that a coefficient of an amplitude equally applied to the respective items is negligible.

In the upconverter 603, assuming now that the output signal of the upconverter 603 which is obtained by being multiplied by the output signal SL0($t$) of the local oscillator 604 is equal to SMIX(t), this transmission intermediate frequency signal 651 is given as follows:

$$\begin{aligned}SMIX(t) &= SL0(t) \cdot SIF(t) \quad (19)\\ &= \cos[\omega L0 t + \varnothing L0] \cdot \{I(t)\cos[\omega IFt] + Q(t)\sin[\omega IFt]\}\\ &= I(t)\{\cos[(\omega L0 + \omega IF)t + \varnothing L0] +\\ &\quad \cos[(\omega L0 - \omega IF)t + \varnothing L0]\} +\\ &\quad Q(t)\{\sin[(\omega L0 + \omega IF)t + \varnothing L0] - \sin[(\omega L0 - \omega IF)t + \varnothing L0]\}\end{aligned}$$

Only such a desirable frequency component of the signal outputted from the upconverter 603 is selected. In the case that the local frequency is higher than the transmission frequency, assuming now that an angular frequency of a transmission signal SUL(t) is equal to $\omega RF$ (=$\omega L0-\omega IF$), this transmission signal SUL(t) is given as follows:

$$SUL(t)=I(t)\cos[\omega RFt+\varnothing L0]-Q(t)\sin[\omega RFt+\varnothing L0] \quad (20)$$

However, in such a case that the local frequency is lower than the transmission frequency, the angular frequency of the transmission signal becomes $\omega RF=\omega L0+\omega IF$, and thus this transmission signal SLL(t) is given as follows:

$$SLL(t)=I(t)\cos[\omega RFt+\varnothing L0]+Q(t)\sin[\omega RFt+\varnothing L0] \quad (21)$$

As a result, this transmission signal SLL(t) may become a different transmission signal, depending upon the frequency relationship between the transmission signal and the local signal.

Accordingly, in such a case, in the quadrature modulator 608, while the switch circuit 614 is switched in response to the band switching signal 653, when the local oscillation signal inputted to the upconverter 603 is penetrated through a signal path involving the inverter circuit 613 for inverting the signal polarity, the transmission intermediate frequency signal 651 may be expressed as follows:

$$SIF(t)=I(t)\cos[\omega IFt]-Q(t)\sin[\omega IFt] \quad (22)$$

The output signal SMIX(t) of the upconverter 603 is given as follows:

$$\begin{aligned}SMIX(t) &= SL0(t) \cdot SIF(t) \quad (23)\\ &= \cos[\omega L0 t + \varnothing L0] \cdot \{I(t)\cos[\omega IFt] - Q(t)\sin[\omega IFt]\}\\ &= I(t)\{\cos[(\omega L0 + \omega IF)t + \varnothing L0] +\\ &\quad \cos[(\omega L0 - \omega IF)t + \varnothing L0]\} +\\ &\quad (Q(t)\{\sin[(\omega L0 + \omega IF)t + \varnothing L0] -\\ &\quad \sin[(\omega L0 - \omega IF)t + \varnothing L0]\}\end{aligned}$$

Now, paying an attention to such a case that the local oscillation frequency is lower than the transmission frequency, since the angular frequency of this transmission signal is equal to $\omega RF=\omega L0+\omega IF$, this transmission signal SLL(t) is given as follows:

$$SLL(t)=I(t)\cos[\omega RFt+\varnothing L0]-Q(t)\sin[\omega RFt+\varnothing L0] \quad (24)$$

As a consequence, it can be understood that the same transmission signal SLL(t) as that obtained when the local oscillation frequency is higher than the transmission frequency can be obtained.

It should be noted that as a modification of this sixth embodiment mode, the phase shifter 612, the inverter circuit 613, and the switch circuit 614 employed in the quadrature modulator 608 may be arranged by a DSP (digital signal processor) and the like, and these circuit elements may be realized as processing steps of a computer program executed by this DSP.

In other words, this modification is operated as follows: At a first supplying step corresponding to the phase shifter 612, such a signal obtained by shifting the phase of the transmission local oscillation signal by $\pi/2$ is supplied via a D/A converter to the quadrature mixer 609. At an inverting step corresponding to the inverter circuit 613, the code polarity of the transmission local signal is inverted. At a second supplying step corresponding to the switch circuit 614, any one of the transmission local oscillation signal and the transmission local oscillation signal inverted at the inverting step is switched in response to the band switching signal 653, and then the switched signal is supplied via a D/A converter to the quadrature mixer 610.

As previously described, in accordance with the multiband data communication apparatus and also the communication method of the multiband data communication apparatus, according to this sixth embodiment mode, since the phase of the transmission local oscillation signal is changed in response to the band switching signal 653, to thereby be supplied to both the quadrature mixers 609 and 610, the desirable transmission intermediate frequency signal can be obtained irrespective of the frequency relationship between the transmission signal and the local oscillation signal.

Moreover, in the quadrature modulator 608, such a signal produced by shifting the phase of the transmission local oscillation signal by $\pi/2$ by the phase shifter 612 is supplied to the quadrature mixer 609. The switch circuit 614 supplies to the quadrature mixer 610, any one of the transmission local oscillation signal which is switched in response to the band switching signal 653, and the transmission local signal whose code polarity is inverted by the inverter circuit 613. As previously explained, only the inverter circuit 613 and the switch circuit 614 are employed as the structural elements which are additionally provided so as to execute the correct modulating process operation in accordance with the band switching control by the band switching signal 653. As a result, the increase in the additionally provided circuit scale can be suppressed, and also the entire circuit arrangement can be suitably formed in an integrated circuit, as compared with such a conventional circuit arrangement that the polarity of the transmission baseband signal itself is switched by the waveform generating circuit.

Furthermore, since the correct modulating process operation can be carried out in accordance with the band switching control by receiving the band switching signal 653, the deteriorations of the transmission baseband signals 657 and 658 can be avoided. To the contrary, conventionally, the transmission baseband signal is directly processed to invert the code polarities of the quadrature components.

Seventh Embodiment

Figure 7:
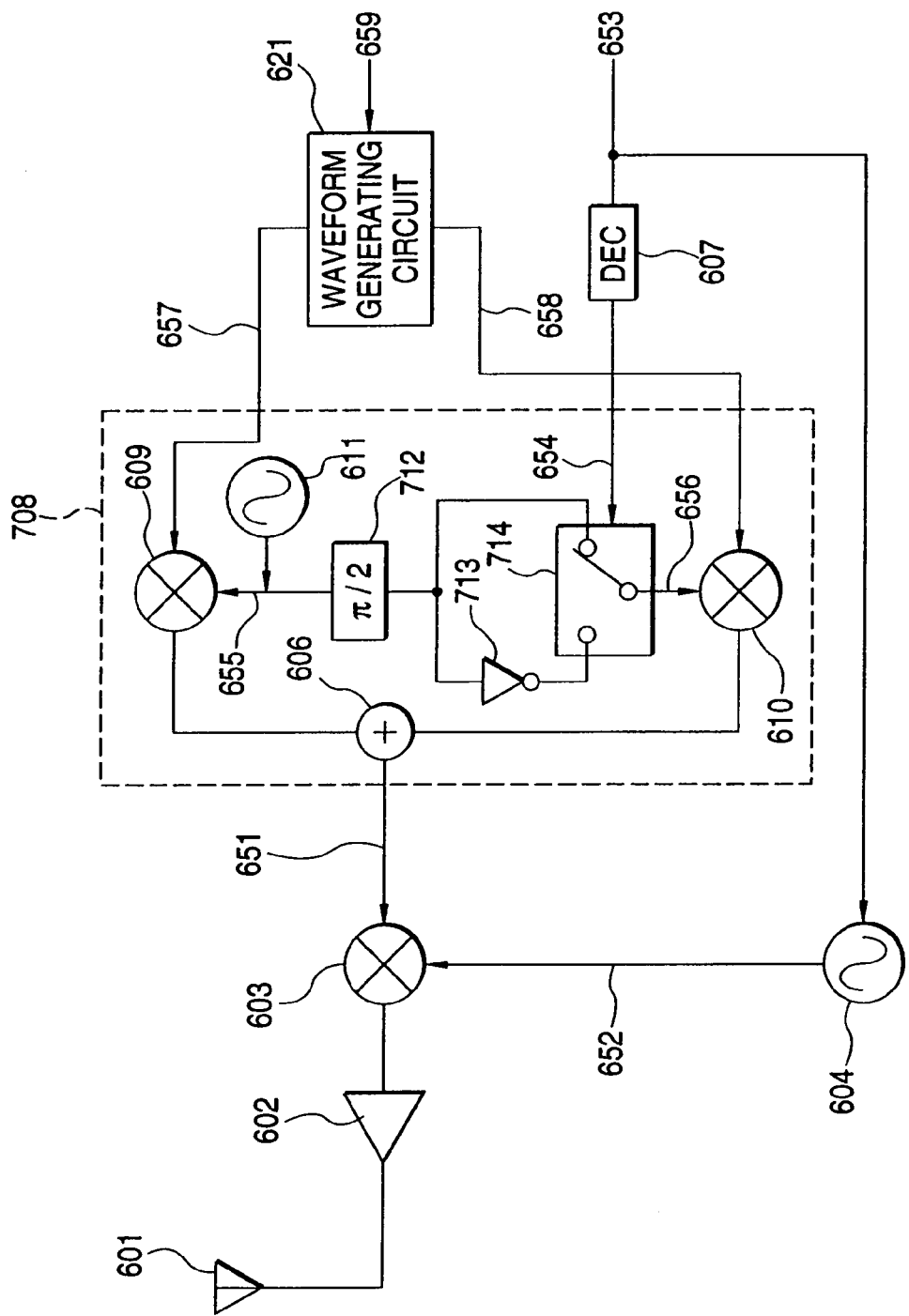
FIG. 7 is a structural diagram of a multiband data communication apparatus according to a seventh embodiment mode of the present invention.

Next, FIG. 7 is a structural diagram of a multiband data communication apparatus to which either a multiband data communication apparatus or a communication method, according to a seventh embodiment mode of the present invention, is applied. It should be noted that the same reference numerals shown in FIG. 6 (sixth embodiment mode) will be employed as those for denoting the same, or similar circuit elements of this drawing, and descriptions thereof are omitted.

In the sixth embodiment mode, the phase of the transmission local oscillation signal entered into the quadrature mixer 610 is switched so as to obtain the desirable transmission intermediate frequency signal irrespective of the frequency relationship between the transmission signal and the transmission local oscillation signal. To achieve the same effect as that of the sixth embodiment mode, transmission local oscillation signals whose phases are made different from each other are entered into both the quadrature mixers 609 and 610, and furthermore, a phase relationship between these phases of the transmission local oscillation signals is switched in response to the band switching signal 653. In other words, as to the quadrature modulator 608 employed in the sixth embodiment mode of FIG. 6, the quadrature modulator of this seventh embodiment mode may be realized by changing the position of the phase shifter 612 into such a position (712) shown in FIG. 7.

Also, in FIG. 7, a quadrature modulator 708 is arranged by employing quadrature mixers (second quadrature mixers) 609 and 610; a transmission local oscillator (local oscillating means) 611; a phase shifter 712; an inverter circuit 713; and also a switch circuit 714. The transmission local oscillator 611 oscillates a transmission local oscillation signal (local oscillation signal). The phase shifter 712 shifts the phase of the transmission local oscillation signal. The inverter circuit 713 inverts the transmission local oscillating signal. The switch circuit 714 selects that which transmission local oscillation signal should be entered into the quadrature mixer 610 among a plurality of transmission local oscillation signals having different phases from each other.

Similar to the sixth embodiment mode, it should be understood that as a modification of this seventh embodiment mode, the phase shifter 712, the inverter circuit 713, and the switch circuit 714 employed in the quadrature modulator 708 may be arranged by a DSP (digital signal processor) and the like, and these circuit elements may be realized as processing steps of a computer program executed by this DSP.

In other words, this modification is operated as follows: At a first supplying step, the transmission local oscillation signal is supplied via a D/A converter to the quadrature mixer 609. At a phase shift step corresponding to the phase shifter 712, the phase of the transmission local signal is shifted by $\pi/2$. At an inverting step corresponding to the inverter circuit 713, the code polarity of the output signal of the phase shift step is inverted. At a second supplying step corresponding to the switch circuit 714, any one of the output signal of the phase shift step and the output signal of the inverting step is switched in response to the band switching signal 653 to thereby be supplied via a D/A converter to the quadrature mixer 610.

As previously described, in accordance with the multiband data communication apparatus and also the communication method of the multiband data communication apparatus, according to this seventh embodiment mode, in the quadrature modulator 708, the transmission local oscillating signal is supplied to the quadrature mixer 609, and the switch circuit 714 switches the signal obtained by shifting the phase of the transmission local oscillation signal by $\pi/2$ by the phase shifter 712, or the signal produced by inverting the code polarity of the output signal from the phase shifter 712 by the inverter circuit 713 in response to the band switching signal 653. As previously explained, only the inverter circuit 713 and the switch circuit 714 are employed as the structural elements which are additionally provided so as to execute the correct modulating process operation in accordance with the band switching control by the band switching signal 653. As a result, the increase in the additionally provided circuit scale can be suppressed, and also the entire circuit arrangement can be suitably formed in an integrated circuit. Also, similar to the sixth embodiment mode, there is such an effect that the deteriorations in the transmission baseband signals 657 and 658 can be prevented.

Eighth Embodiment

Figure 8:
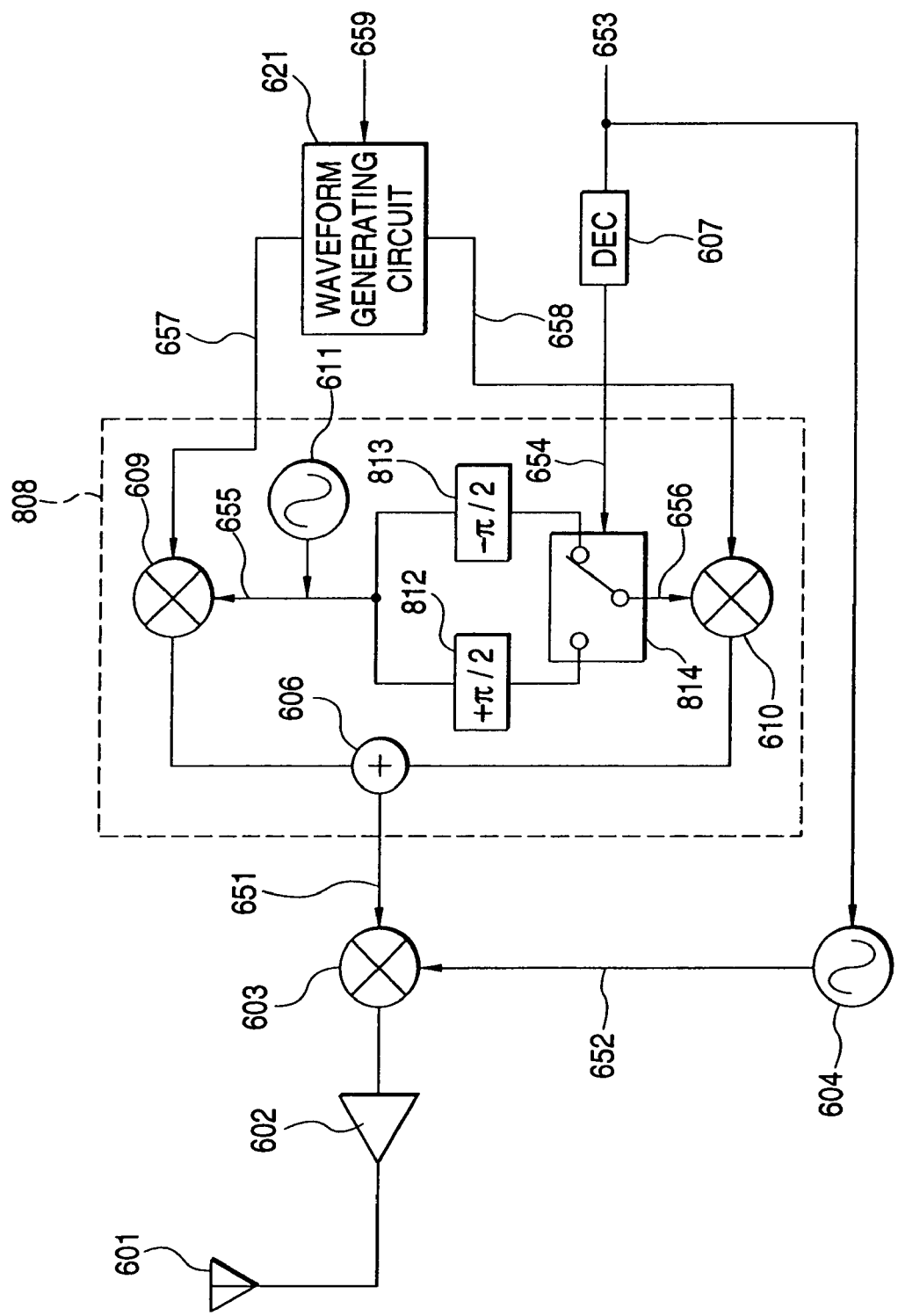
FIG. 8 is a structural diagram of a multiband data communication apparatus according to an eighth embodiment mode of the present invention.

Next, FIG. 8 is a structural diagram of a multiband data communication apparatus to which either a multiband data communication apparatus or a communication method, according to an eighth embodiment mode of the present invention, is applied. It should be noted that the same reference numerals shown in FIG. 6 (sixth embodiment mode) will be employed as those for denoting the same, or similar circuit elements of this drawing, and descriptions thereof are omitted. To achieve the same effect as that of the sixth embodiment mode, in a quadrature modulator 808 according to this eighth embodiment mode, a switch circuit 814 switches an output signal derived from a phase shifter 812 and another output signal derived from another phase shifter 813, the phase change amounts of which are different from each other.

Also, in FIG. 8, the quadrature demodulator 808 is arranged by employing quadrature mixers (second quadrature mixers) 609 and 610, a transmission local oscillator (local oscillating means) 611; the phase shifters 812 and 813; and also the switch circuit 814. The transmission local oscillator 611 oscillates a transmission local oscillation signal (local oscillation signal). The phase shifters 812 and 813 shift the phase of the transmission local oscillation signal. The switch circuit 814 selects that which transmission local oscillation signal should be entered into the quadrature mixer 610 among a polarity of transmission local oscillation signals having different phases from each other.

Similar to the sixth embodiment mode, it should also be noted that as a modification of this eighth embodiment mode, the phase shifters 812 and 813, and the switch circuit 814 employed in the quadrature demodulator 808 may be arranged by a DSP (digital signal processor) and the like, and these circuit elements may be realized as processing steps of a computer program executed by this DSP.

In other words, at a first supplying step, the transmission local oscillation signal is supplied via a D/A converter to the quadrature mixer 609, and at a phase delaying step corresponding to the phase shifter 812, the phase of the transmission local oscillation signal is delayed by $\pi/2$, whereas at a phase advancing step corresponding to the phase shifter 813, the phase of the transmission local oscillation signal is advanced by $\pi/2$. Then, at a second supplying step corresponding to the switch circuit 814, any one of the output signal obtained at the phase delaying step and the output signal obtained at the phase advancing step is switched in response to the band switching signal 653 to thereby be supplied via a D/A converter to the quadrature mixer 610.

As previously explained, in the multiband data communication apparatus and the communication method of the multiband data communication apparatus, according to this eighth embodiment mode, in the quadrature modulator 808, the transmission local oscillation signal is supplied to the quadrature mixer 609. The switch circuit 814 switches any one of the signal obtained by delaying the phase of the transmission local oscillation signal by π/2 by the phase shifter 812, and also the signal obtained by advancing the phase of the transmission local signal by the phase shifter 813 in response to the band switching signal 653. Then, the switch circuit 814 supplies the selected signal to the quadrature mixer 610. As previously explained, only the phase shifter 813 and the switch circuit 814 are employed as the structural elements which are additionally provided so as to execute the correct modulating process operation in accordance with the band switching control by the band switching signal 653. As a result, the increase in the additionally provided circuit scale can be suppressed, and also the entire circuit arrangement can be suitably formed in an integrated circuit, as compared with such a conventional circuit arrangement that the polarity of the transmission baseband signal itself is switched by the waveform generation circuit. Also, similar to the sixth embodiment mode, there is such an effect that the deteriorations in the reception baseband signals 657 and 658 can be prevented.

Ninth Embodiment

Figure 9:
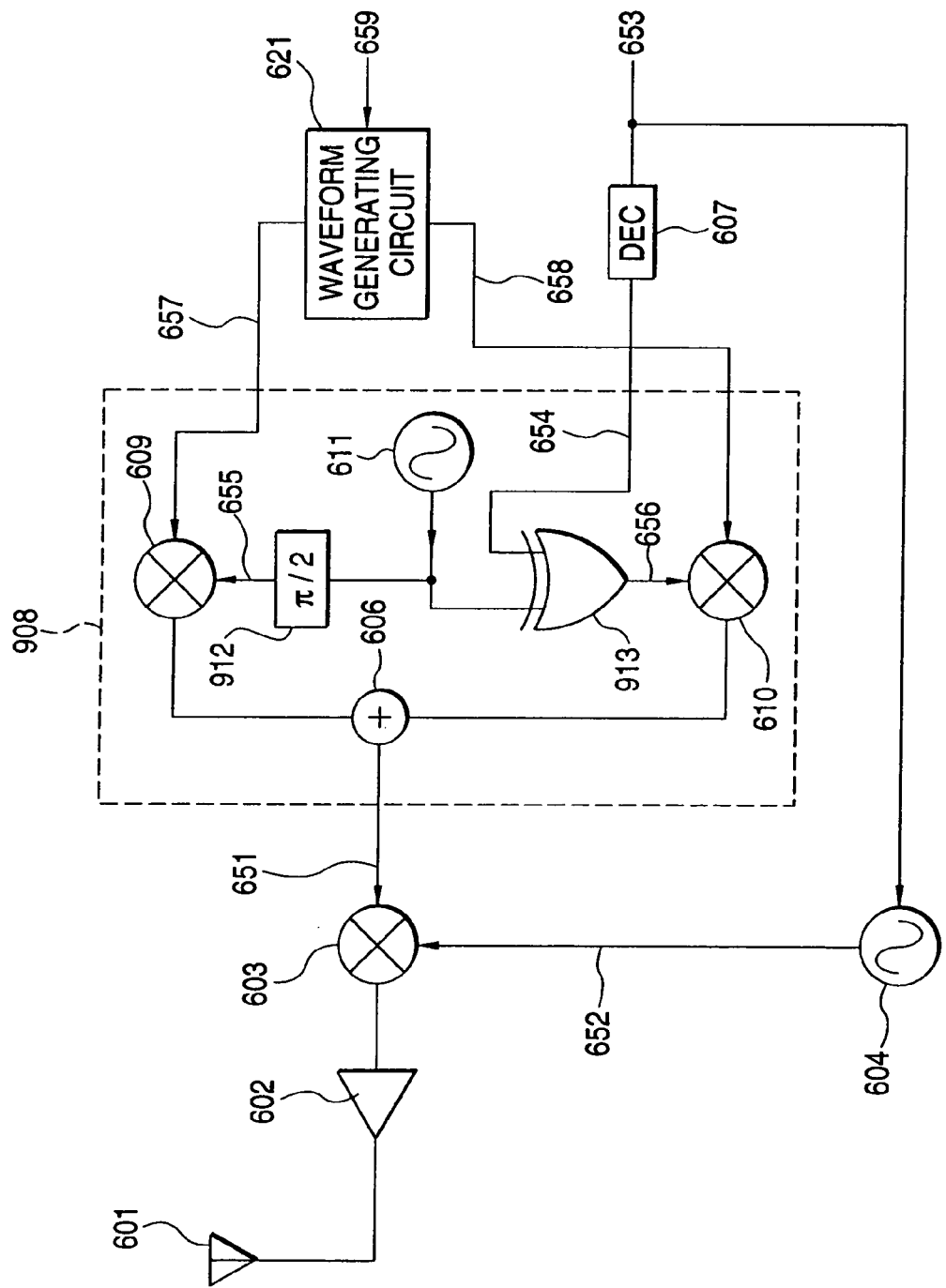
FIG. 9 is a structural diagram of a multiband data communication apparatus according to a ninth embodiment mode of the present invention.

Next, FIG. 9 is a structural diagram of a multiband data communication apparatus to which either a multiband data communication apparatus or a communication method, according to a ninth embodiment mode of the present invention, is applied. It should be noted that the same reference numerals shown in FIG. 6 (sixth embodiment mode) will be employed as those for denoting the same, or similar circuit elements of this drawing, and descriptions thereof are omitted. This ninth embodiment mode is featured by that in the quadrature modulator 608 of the sixth embodiment mode, both the inverter circuit 613 and the switch circuit 614 are replaced by an exclusive OR gate circuit 913.

In FIG. 9, in a quadrature demodulator 908 according to this ninth embodiment mode, both a transmission local oscillation signal and a decoded result (digital binary signal) 654 of a band switching signal 653 are entered into the exclusive OR gate circuit 913. In response to the value of the decoded result 654 of the band switching signal, the exclusive OR gate circuit 913 inverts the transmission local oscillation signal to output the inverted transmission local oscillation signal to the quadrature mixer 610, or directly outputs the transmission local oscillation signal to this quadrature mixer 610. As a result, even when such a circuit arrangement is employed, it is possible to achieve a similar effect to that of the sixth embodiment mode.

Similar to the sixth embodiment mode, it should also be understood that as a modification of this ninth embodiment mode, a phase shifter 912, and the exclusive OR gate circuit 913 employed in the quadrature demodulator 908 may be arranged by a DSP (digital signal processor) and the like, and these circuit elements may be realized as processing steps of a computer program executed by this DSP. That is to say, at a first supplying step corresponding to the phase shifter 912, such a signal obtained by shifting the phase of the transmission local oscillation signal by π/2 is supplied via a D/A converter to the quadrature mixer 609. At an exclusive OR-gating step corresponding to the exclusive OR gate circuit 913, such a signal obtained by exclusively OR-gating both the transmission local oscillation signal and the decoded result 654 of the band switching signal 653 is supplied via a D/A converter to the quadrature mixer 610.

Also, similar to the modifications related to the sixth embodiment mode and the seventh embodiment mode, the position of the phase shifter 912 may be changed into such a position (indicated by 712) shown in FIG. 7. Also, even when the circuit arrangement having such a changed structure is realized as processing steps of a program executed by the DSP, a similar effect may be apparently achieved.

Tenth Embodiment

Figure 10:
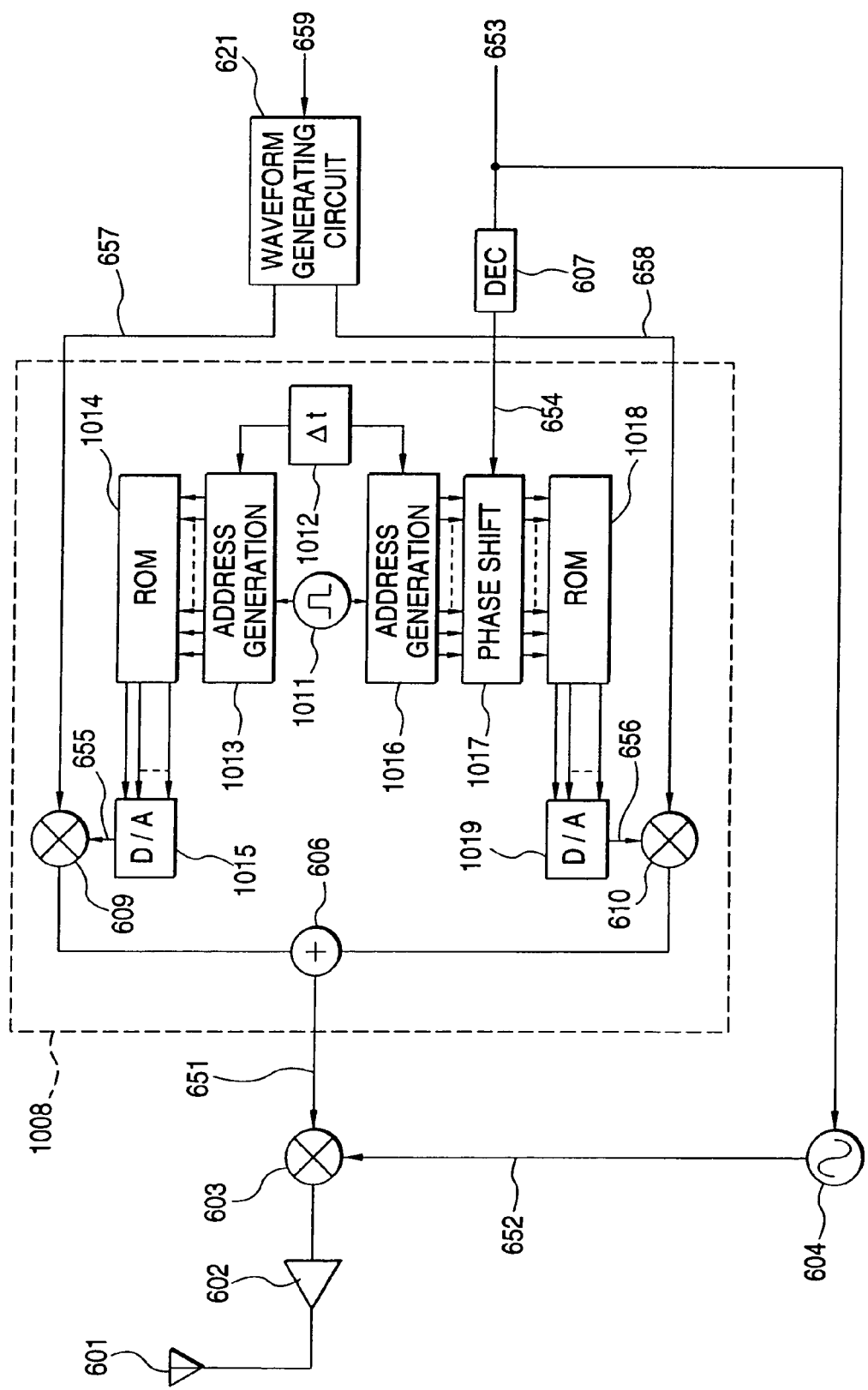
FIG. 10 is a structural diagram of a multiband data communication apparatus according to a tenth embodiment mode of the present invention.

Next, FIG. 10 is a structural diagram of a multiband data communication apparatus to which either a multiband data communication apparatus or a communication method, according to a tenth embodiment mode of the present invention, is applied. It should be noted that the same reference numerals shown in FIG. 6 (sixth embodiment mode) will be employed as those for denoting the same, or similar circuit elements of this drawing, and descriptions thereof are omitted. This tenth embodiment mode is featured by that a DDS is employed as a means for producing a transmission local oscillation signal in a quadrature demodulator 1008.

In FIG. 10, a quadrature modulator 1008 is arranged by employing: quadrature mixers (first quadrature mixers) 609 and 610 for converting entered transmission baseband signals 657 and 658 into a transmission intermediate frequency signal; memories 1014 and 1018 (storing means) for saving thereinto discrete data of a frequency pattern component functioning as a base; address generating units 1013 and 1016 for generating an address every preselected clock; a phase shift unit 1017 for adding a predetermined number based upon the band switching signal 653 to the address so as to shift a phase; a D/A converting unit (first analog converting means) 1015 for analog-converting data which is read out by addressing the memory 1014 based on the address outputted from the address generating unit 1013 to thereby supply the analog-converted data to the quadrature mixer 609; and another D/A converting unit (second analog converting means) 1019 for analog-converting data which is read out by addressing the memory 1018 based on the output of the phase shift unit 1017 to thereby supply the analog-converted data to the quadrature mixer 610. The predetermined number is such a number used to advance a phase of a signal 656 by π/2, or to delay the phase of this signal 656 by π/2.

Also, the quadrature modulator 1008 is comprised of: a clock generating unit 1011 for generating a clock signal; and an interval determining unit 1012 for determining a clock interval "Δt" used to read out data from the memories 1014 and 1018 so as to control the address generating operation of the address generating units 1013 and 1016. Since this clock interval "Δt" of the interval determining unit 1012 is set, the frequency of the produced transmission local oscillation signal can be arbitrarily controlled. It should also be noted that a DEC 607 provided with the quadrature modulator 1008 is such a decoder which decodes the band switching signal 653 so as to produce a control signal 654 to the phase shift unit 1017.

Similar to the sixth embodiment mode, it should be noted that as a modification of this tenth embodiment mode, the DDS portion except for the quadrature mixers 609 and 610 employed in the quadrature modulator 1008 may be arranged by a DSP (digital signal processor) and the like, and these circuit elements may be realized as processing steps of a computer program executed by this DSP.

In other words, the communication method of the multiband data communication apparatus, according to the tenth embodiment, is realized by employing: a storing step for saving discrete data of a frequency pattern component functioning as a base into the memories 1014 and 1018; an address generating step for generating an address every preselected clock; a phase shifting step for adding a predetermined number based upon the band switching signal 653 to the address; a first analog converting step for analog-converting data which is read out by addressing the data saved in the memory 1014 based on the address outputted from the address generating step to thereby supply the analog-converted data to the quadrature mixer 609; and a second analog converting step for analog-converting data which is read out by addressing the data saved in the memory 1018 based on the output of the phase shifting step to thereby supply the analog-converted data to the quadrature mixer 610. The address generating step corresponds to the address generating units 1013 and 1016. The phase shifting step corresponds to the phase shifting unit 1017. The predetermined number is such a number used to advance the phase of the signal 656 by $\pi/2$, or to delay the phase of this signal 656 by $\pi/2$. The first analog converting step corresponds to the D/A converting unit 1015. The second analog converting step corresponds to the D/A converting unit 1019.

As previously described, in accordance with the multiband data communication apparatus and also the communication method of the multiband data communication apparatus, according to this tenth embodiment mode, since the phase of the transmission local oscillation signal is changed in response to the band switching signal 653 to thereby be supplied to the quadrature mixer 610, the desirable transmission intermediate frequency signal can be obtained irrespective of the frequency relationship between the transmission signal and the local oscillation signal.

Moreover, in the quadrature modulator 1008, the structural elements (processing steps) additionally provided so as to perform the correct modulating process operation in accordance with the band switching control by receiving the band switching signal 653 may be realized by either the DDS or the DSP. As a result, the increase in the additionally provided circuit scale (processing step) can be suppressed, and also the entire circuit arrangement can be suitably formed in an integrated circuit, as compared with such a conventional circuit arrangement. Also, similar to the sixth embodiment mode, there is such an effect that the deteriorations in the transmission baseband signals 657 and 658 can be prevented.

Eleventh Embodiment

Figure 11:
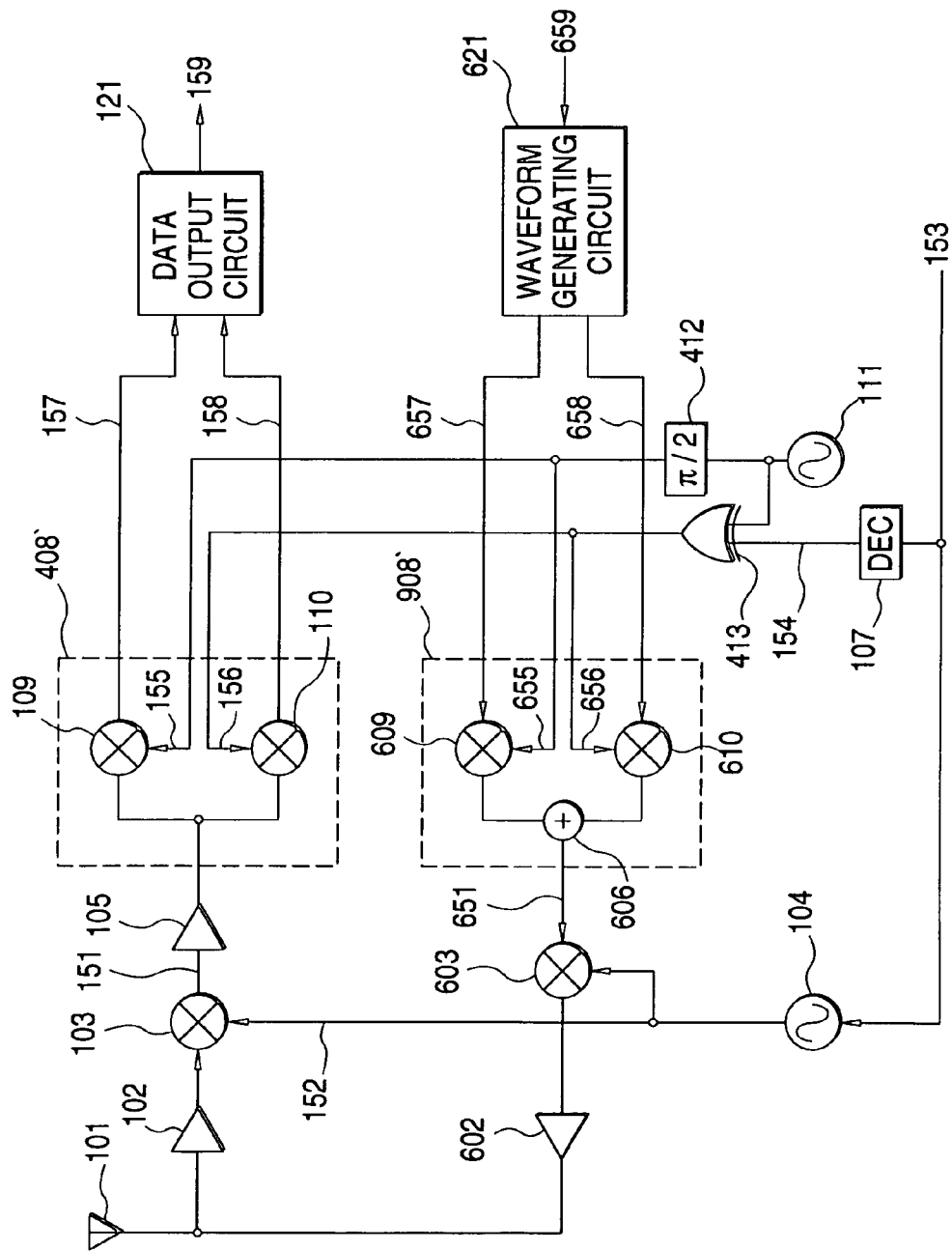
FIG. 11 is a structural diagram of a multiband data communication apparatus according to an eleventh embodiment mode of the present invention.
Figure 12:
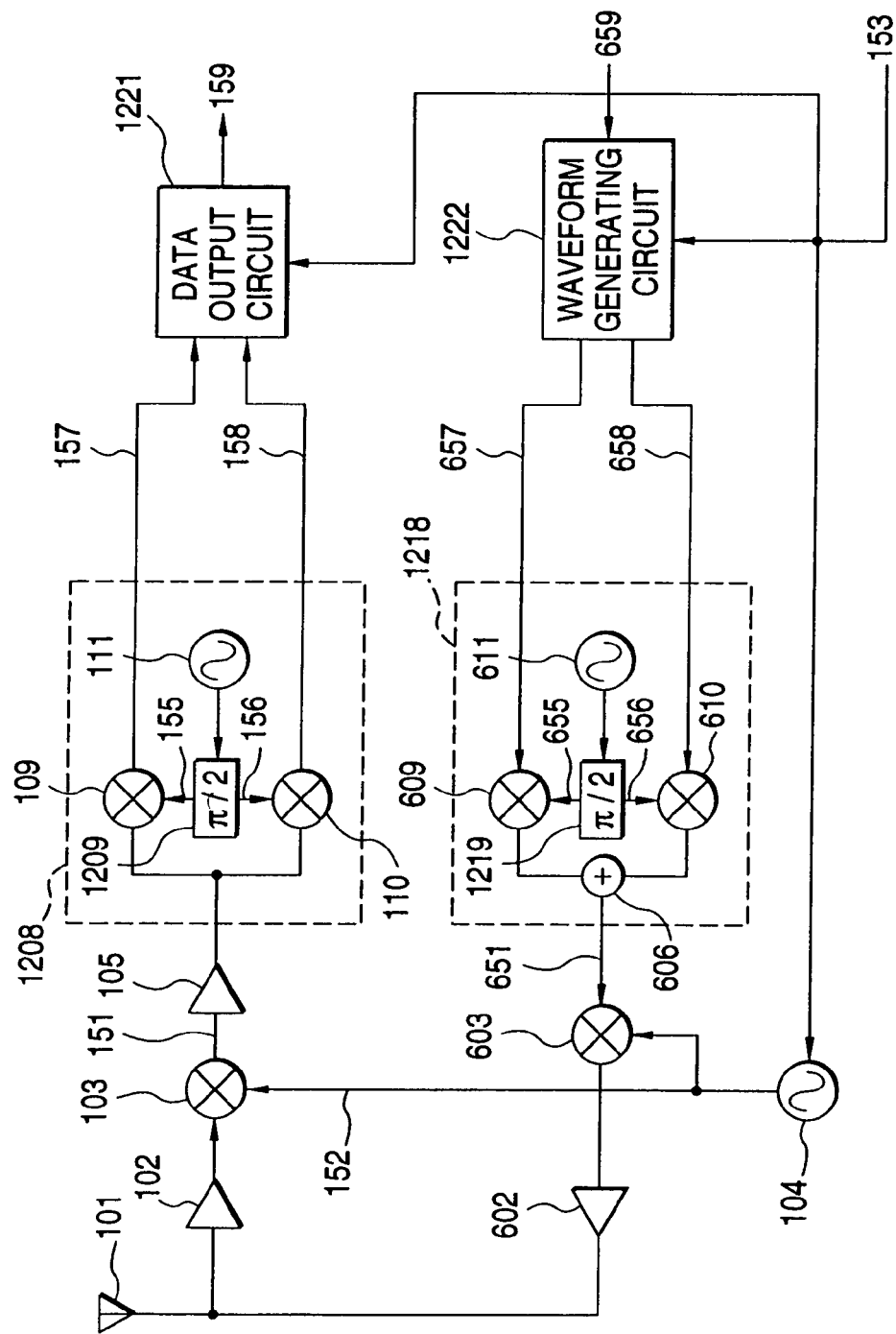
FIG. 12 is a structural diagram of the conventional multiband data communication apparatus.
Figure 1:
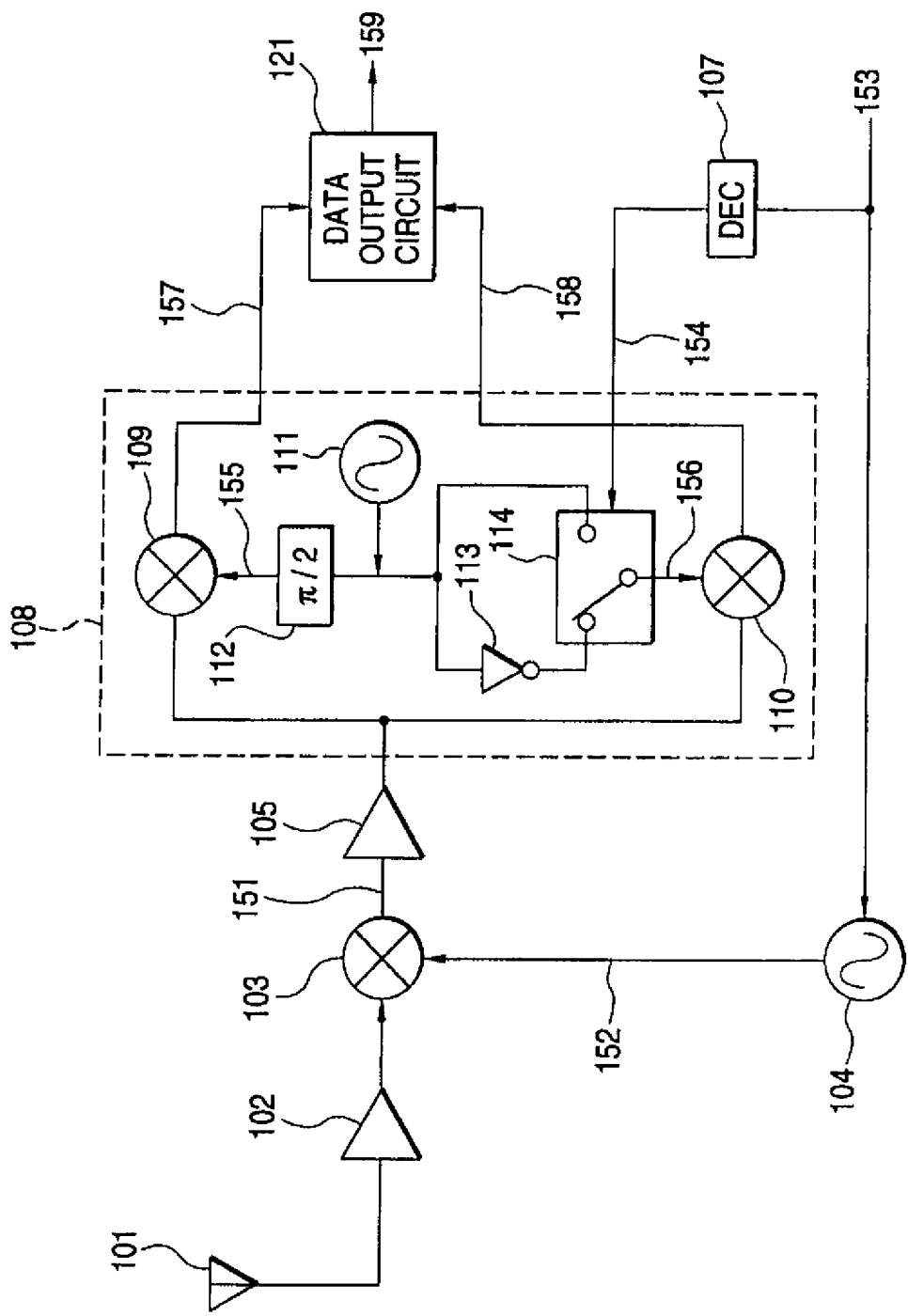

FIG. 11 is a structural diagram for indicating either a multiband data communication apparatus or a multiband data communication apparatus to which a communication method is applied, according to an eleventh embodiment mode of the present invention. It should be understood that the same reference numerals shown in the prior art (FIG. 12), the fourth embodiment mode (FIG. 4), and the ninth embodiment mode (FIG. 9) will be employed as those for denoting the same circuit elements shown in the drawing. This eleventh embodiment mode is directed to such a multiband data communication apparatus for transmitting/receiving communication data by switching a plurality of frequency bands in response to a band switching signal, and is featured by that both the fourth embodiment mode and the ninth embodiment mode are applied to a receiver unit and a transmitter unit provided in such a multiband data communication apparatus.

In FIG. 11, the multiband data communication apparatus, according to this eleventh embodiment mode, is arranged by an antenna 101, a local oscillator 104, a receiver unit, a transmitter unit, and also a local oscillation signal generating unit. In this case, the receiver unit is equipped with a radio frequency (high frequency) amplifier 102, a downconverter 103, an intermediate frequency amplifier 105, a quadrature demodulator 408', and a data output circuit 121. The transmitter unit is equipped with a (high power) power amplifier 602, an upconverter 603, a quadrature modulator 908', and a waveform generating circuit 621.

Also, the local oscillation signal generating unit is so arranged as to commonly circuit portions capable of generating a local oscillation signal supplied to two sets of quadrature mixers in the quadrature demodulator 408 of the fourth embodiment mode, and the quadrature modulator 908 of the ninth embodiment mode. This local oscillation signal generating unit is provided with a local oscillator (local oscillating means) 111, a phase shifter 412, an exclusive OR gate circuit 413, and a decoder (DEC) 107. In this case, both the phase shifter 412 and the exclusive OR gate circuit 413 correspond to a phase shifting means.

In other words, such a signal produced by shifting a phase of a local oscillation signal of the local oscillator 111 by the phase shifter 412 by $\pi/2$ is supplied to one mixer of the quadrature mixers 109 and 609. While the local oscillation signal and the decoded result 154 by the decoder 107 by the band switching signal 153 are inputted to the exclusive OR gate circuit 413, either the signal obtained by inverting the local oscillation signal or the non-inverted local oscillation signal in accordance with the value of the decoded result 154 of the band switching signal 153 is supplied to the other mixer of the quadrature mixers 109 and 609. As a result, the local oscillation signals having the respective frequencies suitable for the respective frequency bands may be outputted to the respective quadrature mixers, so that both the quadrature demodulator 408' and the quadrature modulator 609' may be operated in the correct manner.

First, in the receiver unit, a modulated reception signal which is received by the antenna 101 is amplified by the RF amplifier 102, and thereafter the amplified reception signal is entered into the downconverter 103. The downconverter 103 may output such signals having frequencies which are defined by adding the frequency of the amplified reception signal to a frequency of a local oscillation signal 152 outputted from the local oscillator 104, and also by subtracting the frequency of the amplified reception signal from the frequency of the local oscillation signal 152. In this case, for instance, while using either a low-pass filter or a high-pass filter, the downconverter 103 selects as a reception intermediate frequency signal 151, a signal having such a subtraction frequency lower than the frequency of the received RF signal. The reception intermediate frequency signal 151 having the frequency lower than the frequency of the reception signal, which is outputted from the downconverter 103 is amplified by the intermediate frequency amplifier 105. Then, the amplified intermediate frequency signal is entered into the quadrature demodulator 408'.

The quadrature demodulator 408' is arranged by two sets of quadrature mixers 109 and 110. The quadrature mixers 109 and 110 convert the reception intermediate frequency signal into a reception baseband signal 157 and another reception baseband signal 158. The quadrature mixers 109 and 110 enter thereinto the amplified reception intermediate frequency signal, and the output signal 155 of the phase shifter 412, and also the output signal 156 of the exclusive OR gate circuit 413, and then output two sets of reception baseband signals 157 and 158 whose phase difference is 90 degrees. The data output circuit 121 decodes reception data 159 by utilizing a phase relationship between the reception baseband signals 157 and 158 having the phase difference by 90 degrees from each other.

On the other hand, in the transmitter unit, the waveform producing circuit 621 into which transmission data 659 is inputted produces both a transmission baseband signal 657 and another transmission baseband 658, which may have a phase relationship in accordance with the entered transmission data 659. Then, the waveform producing circuit 621 enters the transmission baseband signals 657 and 658 to the quadrature modulator 908'.

The quadrature modulator 908' is arranged by two sets of quadrature mixers 609 and 610, and also an adder 606. The quadrature mixers 609 and 610 convert the transmission baseband signals 657 and 658 into the intermediate frequency signals. The adder 606 adds two sets of intermediate frequency signals outputted from two sets of the quadrature mixers 609 and 610 to each other, and then outputs a transmission intermediate frequency signal 651. In other words, two sets of the transmission baseband signals 657 and 658 which own the phase difference in accordance with the transmission data 659, the output signal 655 of the phase shifter 412, and the output signal 656 of the exclusive OR gate circuit 413 are inputted to both the quadrature mixers 609 and 610, so that the transmission intermediate frequency signals are outputted from these quadrature mixers 609 and 610.

The upconverter 603 outputs signals having frequencies obtained by adding and subtracting the frequency of the entered transmission intermediate frequency signal 651 and the frequency of the entered local oscillation signal 152. For example, in this case, while employing either a high-pass filter or a band-pass filter, this upconverter 603 selects such a signal having a summation frequency higher than the original frequency as a transmission RF signal. The transmission RF signal derived from the upconverter 603 is amplified by the (high power) power amplifier 602, and then the amplified power transmission RF signal is outputted from the antenna 101 as the transmission signal.

It should also be understood that as a modification of this eleventh embodiment mode, the phase shifter 412 of the local oscillation signal generating unit, and the exclusive OR gate circuit 413 may be arranged by a DSP (digital signal processor) and the like, and these circuit elements may be realized as processing steps of a computer program executed by this DSP.

That is to say, at a first supplying step corresponding to the phase shifter 412, such a signal obtained by shifting the phase of the local oscillation signal by $\pi/2$ is supplied via a D/A converter to one mixer of the quadrature mixers 109 and 609. At an exclusive OR-gating step corresponding to the exclusive OR gate circuit 413, such a signal obtained by exclusively OR-gating both the local oscillation signal and the decoded result 154 of the band switching signal 153 is supplied via a D/A converter to the other mixer of the quadrature mixers 110 and 610.

As previously described, in accordance with the multiband data communication apparatus and also the communication method of the multiband data communication apparatus, according to this eleventh embodiment mode, since the phase of the local oscillation signal is changed in response to the band switching signal 153 to thereby be supplied to the quadrature mixers 109 and 110 and also 609 and 610, the same reception baseband signal can be obtained irrespective of the frequency relationship between the reception signal and the local oscillation signal. Furthermore, a desirable transmission intermediate frequency signal can be obtained irrespective of the frequency relationship between the transmission signal and the local oscillation signal.

Moreover, in the local oscillation signal generating unit, such a signal produced by shifting the phase of the local oscillation signal by $\pi/2$ by the phase shifter 412 is supplied to one mixer of the quadrature mixers 109 and 609. The switch circuit supplies to the other mixer of the quadrature mixers 110 and 610 from the exclusive OR gate circuit 413, any one of the local oscillation signal which is switched in response to the band switching signal 153, and the local oscillation signal whose code polarity is inverted. As previously explained, only the exclusive OR gate circuit 413 is employed as the structural elements which are additionally provided so as to execute the correct modulating/demodulating process operations in accordance with the band switching control by the band switching signal 153. As a result, the increase in the additionally provided circuit scale can be suppressed, and also the entire circuit arrangement can be suitably formed in an integrated circuit, as compared with such a conventional circuit arrangement that the polarity of the reception baseband signal itself is switched by the data output circuit. Also, the polarity of the transmission baseband signal itself is switched by the waveform generating circuit.

Furthermore, since the correct modulating/demodulating process operations can be carried out in accordance with the band switching control by receiving the band switching signal 153, the deteriorations of the baseband signals can be avoided. To the contrary, conventionally, the baseband signal is directly processed to invert the code polarities of the quadrature components.

In the above-explained arrangement according to this eleventh embodiment mode, while the same sort of embodiment modes (namely fourth and ninth embodiment modes) are applied to the receiver unit and the transmitter unit respectively, the common structural portions (i.e., local oscillator 111, phase shifter 412, exclusive OR gate circuit 413, and decoder 107) are commonly used by the local oscillation signal generating unit. Alternatively, the same sorts of other combined embodiment modes (namely, first and sixth embodiment modes; second and seventh embodiment modes; and third and eighth embodiment modes) may be applied to the receiver unit and the transmitter unit, respectively.

Further, although the commonly operable circuit arrangement is limited to the local oscillator 111 and the decoder 107, different sorts of combined embodiment modes may be alternatively realized. For instance, the first embodiment mode may be applied to the receiver unit whereas the seventh embodiment mode may be applied to the transmitter unit. Moreover, even in such an arrangement that the same sort of combined embodiment mode is applied to the receiver unit and the transmitter unit, as the common arrangement portion, both the local oscillator 111 and the decoder 107 may be provided, whereas the respective elements for constituting the phase shifting means may be employed within both the quadrature demodulator and the quadrature modulator.

While the multiband data communication apparatus, the communication method of the multiband data communication apparatus, and the storage medium, according to the present invention, have been described in detail, when a plurality of frequency bands are switched by the band switching signal to receive the communication data, the local oscillation signal is produced by the local oscillating means (local oscillating step), and the phase of the local oscillation signal is changed in response to the band switching signal by the phase shifting means (phase shifting step). Then, the phase-shifted local oscillation signal is supplied to the first quadrature mixer for converting either the reception signal or the reception intermediate frequency signal into the reception baseband signal. As a result, a desirable reception baseband signal can be obtained irrespective of the frequency relationship between the reception signal and the local oscillation signal, and then the correct demodulating process operation can be carried out in accordance with the band switching control by the band switching signal. To this end, only the phase shifting means (phase shifting step) is additionally provided as the structural element (processing step). The increase in the additionally provided circuit scale (processing step) can be suppressed to the minimum circuit scale. Therefore, such an arrangement may be suitably formed in an integrated circuit. Furthermore, the deterioration of the reception baseband signal can be avoided, although conventionally the reception baseband signal is directly processed to invert the code polarities of the quadrature components.

In the multiband data communication apparatus, the communication method, and the storage medium, according to the present invention, when a plurality of frequency bands are switched by the band switching signal to transmit the communication data, the local oscillation signal is produced by the local oscillating means (local oscillating step), and the phase of the local oscillation signal is changed in response to the band switching-signal by the phase shifting means (phase shifting step). Then, the phase-shifted local oscillation signal is supplied to the second quadrature mixer for converting the transmission baseband signal into either the transmission signal or the transmission intermediate frequency signal. As a result, a desirable transmission signal, or a desirable transmission intermediate frequency signal can be obtained irrespective of the frequency relationship between the transmission signal and the local oscillation signal, and then the correct modulating process operation can be carried out in accordance with the band switching control by the band switching signal. To this end, only the phase shifting means (phase shifting step) is additionally provided as the structural element (processing step). The increase in the additionally provided circuit scale (processing step) can be suppressed to the minimum circuit scale. Therefore, such an arrangement may be suitably formed in an integrated circuit. Furthermore, the deterioration of the transmission baseband signal can be avoided, although conventionally the transmission baseband signal is directly processed to invert the code polarities of the quadrature components.

Also, in accordance with the present invention, when a plurality of frequency bands are switched by the band switching signal to transmit/receive the communication data, the local oscillation signal is produced by the local oscillating means (local oscillating step), and the phase of the local oscillation signal is changed in response to the band switching signal by the phase shifting means (phase shifting step). Then, the phase-shifted local oscillation signal is supplied to the first quadrature mixer for converting either the reception signal or the reception intermediate frequency signal into the reception baseband signal. Otherwise, this phase-shifted local oscillation signal is supplied to the second quadrature mixer for converting the transmission baseband signal to either the transmission signal or the transmission intermediate frequency signal. As a result, the correct reception baseband signal and the correct transmission signal can be obtained not depending upon the frequency band, but the correct modulating/demodulating process operations can be carried out in accordance with the band switching control by the band switching signal. To this end, only the phase shifting means (phase shifting step) is additionally provided as the structural element (processing step) in the transmission system and the reception system. The increase in the additionally provided circuit scale (processing step) can be suppressed to the minimum circuit scale. Therefore, such an arrangement may be suitably formed in an integrated circuit. Furthermore, the deteriorations of the reception baseband signal and the transmission baseband signal can be avoided, although conventionally the reception baseband signal and also the transmission baseband signal are directly processed to invert the code polarities of the quadrature components.

Also, in accordance with the present invention, as the structural element (processing step) used to perform the correct modulating/demodulating process operations in accordance with the band switching control by the band switching signal, only either the inverting means (inverting step) and the switching means (second supplying step) or the exclusive OR gating means (exclusive OR gating step) is employed. Alternatively, either the inverting means (inverting step) and the switching means (second supplying step) or the exclusive OR gating means (exclusive OR gating step, otherwise, the phase advancing means (phase advancing step) and the switching means (second supplying step) are employed. Therefore, the increase in the additionally provided circuit scale (processing step) can be suppressed to the minimum circuit scale, and thus, such an arrangement may be suitably formed in an integrated circuit.

Moreover, in accordance with the present invention, when the communication data is transmitted/received by switching a plurality of frequency bands in response to the band switching signal, the discrete data of the frequency pattern component functioning as a base is saved in the storage means (by storing step); the address generating means (address generating step) generates the address every preselected clock; the phase shift means (phase shift step) adds the predetermined number based upon the band switching signal to the address; the first analog converting means (first analog converting step) analog-converts the data which is read out by addressing the data saved in the storage means (storing step) based on the address outputted from the address generating means (address generating step) to thereby supply the analog-converted data to one set of the first quadrature mixer and the second quadrature mixer. The first quadrature mixer converts either the reception signal or the reception intermediate frequency signal into the reception baseband signal. The second quadrature mixer converts the transmission baseband signal into either the transmission signal or the transmission intermediate frequency signal. Also, the second analog converting means (second analog converting step) analog-converts the data which is read out by addressing data saved in the storage means (storage step) in response to the output of the phase shift means (phase shift step), and thereafter supplies the analog-converted data to either the other mixer of the first quadrature mixers and the second quadrature mixer. As a consequence, the structural element (processing step) additionally provided so as to execute the correct modulating/demodulating process operations in accordance with the band switching control by the band switching signal may be realized by the DDS (Direct Digital Synthesizer) and the DSP (Digital Signal Processor) and the like, which are additionally provided in the transmission system and the reception system. As a result, the increase in the additionally provided circuit scale (processing step) can be suppressed to the minimum circuit scale.

Therefore, such an arrangement may be suitably formed in an integrated circuit. Furthermore, the deteriorations of the reception baseband signal and the transmission baseband signal can be avoided, although conventionally the transmission baseband signal and the reception baseband signal are directly processed to invert the code polarities of the quadrature components.

What is claimed is:

1. A multiband data communication apparatus comprising:
    quadrature modulating means for converting a quadrature transmission baseband signal into either a transmission signal or a transmission intermediate frequency signal;
    quadrature demodulating means for converting either a reception signal or a reception intermediate frequency signal into a quadrature reception baseband signal; and
    local oscillation signal producing means for supplying a local oscillation signal to both said quadrature modulating means and said quadrature demodulating means, for transmitting/receiving by switching a plurality of frequency bands in response to a band switching signal,
    wherein said quadrature demodulating means includes a pair of first quadrature mixers for converting either the reception signal or the reception intermediate frequency signal into a reception baseband signal; and wherein
    said quadrature modulating means includes a pair of second quadrature mixers for converting a transmission baseband signal into either the transmission signal or the transmission intermediate frequency signal; and further wherein
    said local oscillation signal producing means includes local oscillating means for producing a local oscillation signal, and said apparatus further comprises
    phase shifting means for shifting a phase of said local oscillation signal based upon said band switching signal to thereby supply the phase-shifted local oscillation signal to one or both of said pair of first quadrature mixers and to one or both of said pair of second quadrature mixers.

2. A multiband data communication apparatus as claimed in claim 1, wherein said phase shifting means supplies a signal obtained by shifting the phase of said local oscillation signal by $\pi/2$ to one of said pair of first quadrature mixers and one of said pair of second quadrature mixers, while said phase shifting means supplies one of said local oscillation signal and a signal obtained by inverting a code of said local oscillation signal to the other of said pair of first quadrature mixers and to the other of said pair of second quadrature mixers in response to said band switching signal.

3. A multiband data communication apparatus as claimed in claim 1, wherein said phase shifting means supplies said local oscillation signal to one of said pair of first quadrature mixers and to one of said pair of second quadrature mixers; while said phase shifting means supplies one of a signal obtained by shifting the phase of said local oscillation signal by $\pi/2$ and a signal obtained by shifting the phase of said local oscillation signal by $\pi/2$ and then inverting said phase-shifted local oscillation signal to the other mixer of said pair of first quadrature mixers and also to the other mixer of said pair of second quadrature mixers in response to said band switching signal.

4. A multiband data communication apparatus as claimed in claim 1, wherein said phase shifting means supplies said local oscillation signal to one of said pair of first quadrature mixers and to one of said pair of second quadrature mixers, while one of a signal obtained by delaying the phase of said local oscillation signal by $\pi/2$ and a signal obtained by advancing the phase of said local oscillation signal by $\pi/2$ to the other of said pair of first quadrature mixers and also to the other of said pair of second quadrature mixers in response to said band switching signal.

5. A multiband data communication apparatus which receives signals by switching a plurality of frequency bands in response to a band switching signal, said multiband data communication apparatus comprising:
    quadrature demodulating means for converting either a reception signal or a reception intermediate frequency signal into quadrature reception baseband signal, said quadrature demodulating means including:
    a pair of first quadrature mixers for converting either the reception signal or the reception intermediate frequency signal into a reception baseband signal;
    storage means for saving thereinto discrete data a frequency pattern component functioning as a base;
    address generating means for generating an address every preselected clock;
    phase shift means for adding a predetermined number based upon said band switching signal to said address;
    first analog converting means for analog-converting data which is read out by addressing said storage means based on the address outputted from said address generating means to thereby supply the analog-converted data to one of said pair of first quadrature mixers; and
    second analog converting means for analog-converting data which is read out by addressing said storage means based on the output of said phase shift means to thereby supply the analog-converted data to the other of said pair of first quadrature mixers.

6. A multiband data communication apparatus as claimed in claim 5, wherein either said quadrature demodulating means includes clock generating means for generating a clock signal and interval determining means for determining a clock interval used to read out data from said storage means so as to control the address generating operation of said address generating means.

7. A multiband data communication apparatus which transmits signals by switching a plurality of frequency band in response to a band switching signal, said multiband data communication apparatus comprising:
    quadrature modulating means for converting a quadrature transmission baseband signal into either a transmission signal or a transmission intermediate frequency signal, said quadrature modulating means including:
    a pair of second quadrature mixers for converting a transmission baseband signal into either the transmission signal or the transmission intermediate frequency signal;
    storage means for saving thereinto discrete data of a frequency pattern component functioning as a base
    address generating means for generating an address every preselected clock;
    phase shift means for adding a predetermined number based upon said band switching signal to said address;
    first analog converting means for analog-converting data which is read out by addressing said storage means based on the address outputted from said address generating means to thereby supply the analog-converted data to one of said pair of second quadrature mixers; and
    second analog converting means for analog-converting data which is read out by addressing said storage means based on the output of said phase shift means to thereby supply the analog-converted data to the other of said pair of second quadrature mixers.

8. A multiband data communication apparatus as claimed in claim 7, wherein either said quadrature modulating means includes clock generating means for generating a clock signal and interval determining means for determining a clock interval used to read out data from said storage means so as to control the address generating operation of said address generating means.

9. A multiband data communication apparatus comprising:
quadrature modulating means for converting a quadrature transmission baseband signal into either a transmission signal or a transmission intermediate frequency signal;
quadrature demodulating means for converting either a reception signal or a reception intermediate frequency signal into a quadrature reception baseband signal; and
local signal producing means for supplying a local oscillation signal to both said quadrature modulating means and said quadrature demodulating means, for transmitting/receiving by switching a plurality of frequency bands in response to a band switching signal, wherein
said quadrature demodulating means includes a pair of first quadrature mixers for converting either the reception signal or the reception intermediate frequency signal into a reception baseband signal; and further wherein
said quadrature modulating means includes a pair of second quadrature mixers for converting a transmission baseband signal into either the transmission signal or the transmission intermediate frequency signal; and still further wherein
said local oscillation signal producing means includes storage means for saving thereinto discrete data of a frequency pattern component functioning as a base; address generating means for generating an address every preselected clock; phase shift means for adding a predetermined number based upon said band switching signal to said address; first analog converting means for analog-converting data which is read out by addressing said storage means based on the address outputted from said address generating means to thereby supply the analog-converted data to one of said pair of first quadrature mixers; and second analog converting means for analog-converting data which is read out by addressing said storage means based on the output of said phase shift means to thereby supply the analog-converted data to the other of said pair of first quadrature mixers.

10. A multiband data communication apparatus as claimed in claim 9, wherein either said quadrature modulating means or said local oscillation signal producing means includes clock generating means for generating a clock signal and interval determining means for determining a clock interval used to read out data from said storage means so as to control the address generating operation of said address generating means.

11. A communication method of a multiband data communication apparatus including quadrature modulating means for converting a quadrature transmission baseband signal into either a transmission signal or a transmission intermediate frequency signal; and quadrature demodulating means for converting either a reception signal or a reception intermediate frequency signal into a quadrature reception baseband signal wherein said apparatus transmits and receives signals by switching a plurality of frequency bands in response to a band switching signal, said communication method comprising the steps of:
producing a local oscillation signal; and
shifting a phase of said local oscillation signal in response to the band switching signal to thereby supply the phase-shifted local oscillation signal to one or both of a first quadrature mixer and a second quadrature mixer, said first quadrature mixer converting either the reception signal or the reception intermediate frequency signal into a reception baseband signal, and said second quadrature mixer converting a transmission baseband signal into either the transmission signal or the transmission intermediate frequency signal.

12. A communication method of a multiband data communication apparatus as claimed in claim 11, wherein said phase shifting step includes:
a first supplying step for supplying a signal which is obtained by shifting the phase of said local oscillation signal by $\pi/2$ to one of said first quadrature mixer and said second quadrature mixer;
an inverting step for inverting a code of said local oscillation signal; and
a second supplying step for supplying one of said local oscillation signal and the output signal of said inverting step to the other of said first quadrature mixer and said second quadrature mixer in response to said band switching signal.

13. A communication method of a multiband data communication apparatus as claimed in claim 11, wherein said phase shifting step includes:
a first supplying step for supplying said local oscillation signal to one of said first quadrature mixer and said second quadrature mixer;
a phase shifting step for shifting the phase of said local oscillation signal by $\pi/2$;
an inverting step for inverting a code of said output signal of said phase shifting step; and
a second supplying step for supplying one of said output signal of said phase shifting step and the output signal of said inverting step to the other of said first quadrature mixer and said second quadrature mixer in response to said band switching signal.

14. A communication method of a multiband data communication apparatus as claimed in claim 11, wherein said phase shifting step includes:
a first supplying step for supplying said local oscillation signal to one of said first quadrature mixer and said second quadrature mixer;
a phase delaying step for delaying the phase of said local oscillation signal by $\pi/2$;
a phase advancing step for advancing the phase of said local oscillation signal by $\pi/2$; and
a second supplying step for supplying one of the output signal of said phase delaying step and the output signal of said phase advancing step to the other of said first quadrature mixer and said second quadrature mixer in response to said band switching signal.

15. A communication method of a multiband data communication apparatus including quadrature demodulating means for converting either a reception signal or a reception intermediate frequency signal into a quadrature reception baseband signal, for receiving by switching a plurality of frequency bands in response to a band switching signal, said communication method comprising:
a storing step for saving discrete data of a frequency pattern component functioning as a base;

an address generating step for generating an address every preselected clock signal;

a phase shifting step for adding a predetermined number based upon said band switching signal to said address;

a first analog converting step for analog-converting data which is read out by addressing said storing step based on the address outputted from said address generating step to thereby supply the analog-converted data to one of a pair of first quadrature mixers for converting either the reception signal or the reception intermediate frequency signal into a reception baseband signal; and a second analog converting step for analog-converting data which is read out by addressing said storing step based on the output of said phase shifting step to thereby supply the analog-converted data to the other of said first quadrature mixers.

16. A communication method of a multiband data communication apparatus including quadrature modulating means for converting a quadrature transmission baseband signal into either a transmission signal or a transmission intermediate frequency signal, for transmitting by switching a plurality of frequency band in response to a band switching signal, said communication method comprising:

a storing step for saving discrete data of a frequency pattern component functioning as a base;

an address generating step for generating an address every preselected clock signal;

a phase shifting step for adding a predetermined number based upon said band switching signal to said address;

a first analog converting step for analog-converting data which is read out by addressing said storing step based on the address outputted from said address generating step to thereby supply the analog-converted data to one of a pair of second quadrature mixers for converting a transmission baseband signal into either the transmission signal or the transmission intermediate frequency signal; and a second analog converting step for analog-converting data which is read out by addressing said storing step based on the output of said phase shifting step to thereby supply the analog-converted data to the other of said second quadrature mixers.

17. A communication method of a multiband data communication apparatus including quadrature modulating means for converting a quadrature transmission baseband signal into either a transmission signal or a transmission intermediate frequency signal; and quadrature demodulating means for converting either a reception signal or a reception intermediate frequency signal into a quadrature reception baseband signal; and for transmitting/receiving by switching a plurality of frequency bands in response to a band switching signal, said communication method comprising:

a storing step for saving discrete data of a frequency pattern component functioning as a base;

an address generating step for generating an address every preselected clock signal;

a phase shifting step for adding a predetermined number based upon said band switching signal to said address;

a first analog converting step for analog-converting data which is read out by addressing said storing step based on the address outputted from said address generating step to thereby supply the analog-converted data to one of a first quadrature mixer and a second quadrature mixer, said first quadrature mixer converting either the reception signal or the reception intermediate frequency signal into a reception baseband signal, and said second quadrature mixer converting a transmission baseband signal into either the transmission signal or the transmission intermediate frequency signal; and a second analog converting step for analog-converting data which is read out by addressing said storing step based on the output of said phase shifting step to thereby supply the analog-converted data to the other of said first quadrature mixer and said second quadrature mixer.

18. A multiband data communication apparatus which receives signals by switching a plurality of frequency bands in response to a band switching signal, said multiband data communication apparatus comprising:

quadrature demodulating means for converting either a reception signal or a reception intermediate frequency signal into a quadrature reception baseband signal, said quadrature demodulating means including;

a pair of first quadrature mixers for converting either the reception signal or the reception intermediate frequency signal into a reception baseband signal;

local oscillating means for producing a local oscillation signal; and phase shifting means for inputting said band switching signal and for shifting a phase of said local oscillation signal based upon said band switching signal to thereby supply the phase-shifted local oscillation signal to one or both of said pair of first quadrature mixers, wherein said phase shifting means supplies a signal obtained by shifting the phase of said local oscillation signal by $\pi/2$ to one of said pair of first quadrature mixers, while said phase shifting means supplies one of said local oscillation signal and a signal obtained by inverting a code of said local oscillation signal to the other of said pair of first quadrature mixers in response to said band switching signal.

19. A multiband data communication apparatus which receives signals by switching a plurality of frequency bands in response to a band switching signal, said multiband data communication apparatus comprising:

quadrature demodulating means for converting either a reception signal or a reception intermediate frequency signal into a quadrature reception baseband signal, said quadrature demodulating means including:

a pair of first quadrature mixers for converting either the reception signal or the reception intermediate frequency signal into a reception baseband signal;

local oscillating means for producing a local oscillation signal; and phase shifting means for inputting said band switching signal and for shifting a phase of said local oscillation signal based upon said band switching signal to thereby supply the phase-shifted local oscillation signal to one or both of said pair of first quadrature mixers, wherein said phase shifting means supplies said local oscillation signal to one of said pair of first quadrature mixers while said phase shifting means supplies one of a signal obtained by shifting the phase of said local oscillation signal by $\pi/2$ and a signal obtained by shifting the phase of said local oscillation signal by $\pi/2$ and then inverting said phase-shifted local oscillation signal to the other mixer of said pair of first quadrature mixers in response to said band switching signal.

20. A multiband data communication apparatus which transmits signals by switching a plurality of frequency band in response to a band switching signal, said multiband data communication apparatus comprising;

quadrature modulating means for converting a quadrature transmission baseband signal into either a transmission signal or a transmission intermediate frequency signal, said quadrature modulating means including;

a pair of second quadrature mixers for converting a transmission baseband signal into either the transmission signal or the transmission intermediate frequency signal;

local oscillating means for producing a local oscillation signal; and chase shifting means for inputting said band switching signal and for shifting a chase of said local oscillation signal based upon said band switching signal to thereby supply the phase-shifted local oscillation signal to one or both of said pair of second quadrature mixers wherein said phase shifting means supplies a signal obtained by shifting the phase of said local oscillation signal by $\pi/2$ to one of said pair of second quadrature mixers, while said phase shifting means supplies one of said local oscillation signal and a signal obtained by inverting a code of said local oscillation signal to the other of said pair of second quadrature mixers in response to said band switching signal.

21. A multiband data communication apparatus which transmits signals by switching a plurality of frequency band in response to a band switching signal, said multiband data communication apparatus comprising:

quadrature modulating means for converting a quadrature transmission baseband signal into either a transmission signal or a transmission intermediate frequency signal, said quadrature modulating means including:

a pair of second quadrature mixers for converting a transmission baseband signal into either the transmission signal or the transmission intermediate frequency signal;

local oscillating means for producing a local oscillation signal; and phase shifting means for inputting said band switching signal and for shifting a phase of said local oscillation signal based upon said band switching signal to thereby supply the phase-shifted local oscillation signal to one or both of said pair of second quadrature mixers wherein said phase shifting means supplies said local oscillation signal to one of said pair of second quadrature mixers while said phase shifting means supplies one of a signal obtained by shifting the phase of said local oscillation signal by $\pi/2$ and a signal obtained by shifting the phase of said local oscillation signal by $\pi/2$ and then inverting said phase-shifted local oscillation signal to the other mixer of said pair of second quadrature mixers in response to said band switching signal.

* * * * *

UNITED STATES PATENT AND TRADEMARK OFFICE
CERTIFICATE OF CORRECTION

PATENT NO. : 7,079,596 B1
APPLICATION NO. : 09/535303
DATED : July 18, 2006
INVENTOR(S) : Yasuaki Namura It is certified that error appears in the above-identified patent and that said Letters Patent is hereby corrected as shown below:

On the Title page, item (56), please insert the following U.S. patent documents:

-- 5,852,784 A  * 12/1998  Ito et al.
   5,966,666 A  * 10/1999  Yamaguchi et al.
   6,014,571 A  *  1/2001  Enoki
   6,026,307 A  *  2/2000  Blom et al.
   6,175,746 B1 *  1/2001  Nakayama et al.
   6,393,299 B1 *  5/2002  Mizumoto et al. --

Please delete "Drawing Sheet 1 of 12", and insert therefor attached Drawing Sheet 1/12.

In Column 3, Line 44, please delete "demodulator" and insert therefor --modulator'--.

In Column 11, Line 41, please delete "demodulating" and insert therefor --modulating--.

In Column 22, Line 53, please delete "528", and insert therefor --518--.

In Column 22, Line 60, please delete "574" and insert therefor --513--.

In Column 30, Lines 19-20, please delete "demodulator" and insert therefor --modulator--.

In Column 43, Claim 20, Line 9, please delete "chase" and insert therefor --phase--.

Signed and Sealed this

Twenty-sixth Day of May, 2009

JOHN DOLL
*Acting Director of the United States Patent and Trademark Office*